(12) United States Patent
Chakraborty

(10) Patent No.: US 12,119,789 B2
(45) Date of Patent: Oct. 15, 2024

(54) VARIABLE GAIN POWER AMPLIFIERS

(71) Applicant: TEXAS INSTRUMENTS INCORPORATED, Dallas, TX (US)

(72) Inventor: Sudipto Chakraborty, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/326,746

(22) Filed: May 31, 2023

(65) Prior Publication Data

US 2023/0318529 A1 Oct. 5, 2023

Related U.S. Application Data

(63) Continuation of application No. 17/573,662, filed on Jan. 12, 2022, now Pat. No. 11,705,863, which is a
(Continued)

(51) Int. Cl.
*H03F 3/213* (2006.01)
*H03B 5/12* (2006.01)
(Continued)

(52) U.S. Cl.
CPC ......... *H03B 5/1212* (2013.01); *H03B 5/1228* (2013.01); *H03B 5/1265* (2013.01);
(Continued)

(58) Field of Classification Search
CPC ... H03B 5/1212; H03B 5/1228; H03F 1/0211; H03F 1/0216; H03F 1/0244;
(Continued)

(56) References Cited

U.S. PATENT DOCUMENTS

| 4,994,757 A | 2/1991 | Bickley et al. |
| 5,834,975 A | 11/1998 | Bartlett |

(Continued)

FOREIGN PATENT DOCUMENTS

| CN | 1918790 A | 2/2007 |
| CN | 1941610 A | 4/2007 |

(Continued)

OTHER PUBLICATIONS

Bazes, Mel, "Two Novel Fully Complementary Self-Biased CMOS Differential Amplifiers," IEEE J. Solid-State Circuits, 4 pages, 26:2, Feb. 1991.

(Continued)

*Primary Examiner* — Levi Gannon
(74) *Attorney, Agent, or Firm* — Michael T. Gabrik; Frank D. Cimino

(57) ABSTRACT

A variable-gain power amplifying technique includes generating, with a network of one or more reactive components included in an oscillator, a first oscillating signal, and outputting, via one or more taps included in the network of the reactive components, a second oscillating signal. The second oscillating signal has a magnitude that is proportional to and less than the first oscillating signal. The power amplifying technique further includes selecting one of the first and second oscillating signals to use for generating a power-amplified output signal, and amplifying the selected one of the first and second oscillating signals to generate the power-amplified output signal.

19 Claims, 15 Drawing Sheets

Related U.S. Application Data continuation of application No. 17/034,099, filed on Sep. 28, 2020, now Pat. No. 11,258,404, which is a continuation of application No. 16/710,239, filed on Dec. 11, 2019, now Pat. No. 10,797,646, which is a continuation of application No. 15/627,249, filed on Jun. 19, 2017, now Pat. No. 10,536,113, which is a continuation of application No. 14/755,462, filed on Jun. 30, 2015, now Pat. No. 9,685,907.

(51) Int. Cl.
| | | |
|---|---|---|
| *H03F 1/02* | (2006.01) | |
| *H03F 3/21* | (2006.01) | |
| *H03F 3/24* | (2006.01) | |
| *H03F 3/45* | (2006.01) | |
| *H03G 1/00* | (2006.01) | |
| *H03G 3/00* | (2006.01) | |
| *H03G 3/30* | (2006.01) | |
| *H04B 1/04* | (2006.01) | |

(52) U.S. Cl.
CPC ......... *H03F 1/0211* (2013.01); *H03F 1/0277* (2013.01); *H03F 3/211* (2013.01); *H03F 3/213* (2013.01); *H03F 3/245* (2013.01); *H03F 3/45* (2013.01); *H03G 1/0005* (2013.01); *H03G 3/004* (2013.01); *H03G 3/3042* (2013.01); *H04B 2001/0416* (2013.01)

(58) Field of Classification Search
CPC .......... H03F 1/0277; H03F 3/189; H03F 3/19; H03F 3/191; H03F 3/193; H03F 3/1935; H03F 3/195; H03F 3/20; H03F 3/21; H03F 3/211; H03F 3/213; H03F 3/24; H03F 3/245; H03G 1/00; H03G 1/0005; H03G 1/0017; H03G 1/0029; H03G 3/00; H03G 3/001; H03G 3/004; H03G 3/30; H03G 3/301; H03G 3/3036; H03G 3/3042; H04B 2001/0408; H04B 2001/0416

See application file for complete search history.

(56) References Cited

U.S. PATENT DOCUMENTS

| | | | |
|---|---|---|---|
| 5,982,233 A | 11/1999 | Hellmark et al. | |
| 6,172,567 B1 | 1/2001 | Ueno et al. | |
| 6,333,675 B1 | 12/2001 | Saito | |
| 6,351,190 B1 | 2/2002 | O'Toole et al. | |
| 6,397,077 B1 | 5/2002 | Jensen | |
| 6,615,028 B1 | 9/2003 | Loke et al. | |
| 6,894,563 B1 | 5/2005 | Si | |
| 6,906,596 B2 | 6/2005 | Kitamura et al. | |
| 7,248,118 B2 | 7/2007 | Ohnishi et al. | |
| 7,345,545 B2 | 3/2008 | Glass et al. | |
| 8,000,737 B2 | 8/2011 | Caimi et al. | |
| 8,183,925 B2 | 5/2012 | Ohta et al. | |
| 8,195,109 B2 | 6/2012 | Rajendran et al. | |
| 8,548,401 B2 | 10/2013 | Sasaki et al. | |
| 8,629,732 B2 | 1/2014 | Trivedi et al. | |
| 8,838,050 B2 | 9/2014 | Jang et al. | |
| 8,913,970 B2 | 12/2014 | Akhi et al. | |
| 9,176,188 B2 | 11/2015 | Chakraborty et al. | |
| 9,264,005 B1 | 2/2016 | Cho et al. | |
| 9,397,710 B2 | 7/2016 | Tsutsui | |
| 2002/0171481 A1 | 11/2002 | Sasho et al. | |
| 2002/0177420 A1* | 11/2002 | Sander | H03G 3/3042 332/149 |
| 2003/0085760 A1* | 5/2003 | Hirvilampi | H03F 1/0272 330/124 R |
| 2004/0009721 A1 | 1/2004 | Stoelinga et al. | |
| 2004/0105033 A1* | 6/2004 | Dauphinee | H03G 3/3036 348/707 |
| 2005/0191976 A1 | 9/2005 | Shakeshaft et al. | |
| 2005/0280471 A1 | 12/2005 | Matsushita et al. | |
| 2006/0066431 A1 | 3/2006 | Anand et al. | |
| 2006/0192618 A1 | 8/2006 | Al-Shyoukh | |
| 2006/0267684 A1* | 11/2006 | Ohnishi | H03F 3/189 330/51 |
| 2007/0024356 A1 | 2/2007 | Plymale, Jr. | |
| 2007/0247217 A1* | 10/2007 | Sorrells | H03F 1/0205 330/2 |
| 2007/0291718 A1 | 12/2007 | Chan et al. | |
| 2008/0019459 A1 | 1/2008 | Chen | |
| 2009/0081968 A1 | 3/2009 | Vinayak et al. | |
| 2009/0201084 A1 | 8/2009 | See et al. | |
| 2009/0295491 A1 | 12/2009 | Tsai et al. | |
| 2010/0166123 A1 | 7/2010 | Pellon et al. | |
| 2010/0219887 A1* | 9/2010 | Ichitsubo | G06F 1/181 330/124 R |
| 2011/0003571 A1 | 1/2011 | Park et al. | |
| 2011/0018640 A1 | 1/2011 | Liang et al. | |
| 2011/0187451 A1* | 8/2011 | Yoon | H03F 1/0277 330/117 |
| 2012/0081163 A1 | 4/2012 | Hesen et al. | |
| 2012/0235757 A1 | 9/2012 | Trivedi et al. | |
| 2012/0238225 A1 | 9/2012 | Mampo | |
| 2013/0005286 A1 | 1/2013 | Chan et al. | |
| 2013/0051416 A1* | 2/2013 | Schmelzer | H01S 3/09702 372/38.07 |
| 2013/0051493 A1 | 2/2013 | Mo et al. | |
| 2013/0084799 A1 | 4/2013 | Marholev et al. | |
| 2014/0077874 A1* | 3/2014 | Ahmed | H03F 3/195 330/124 R |
| 2014/0118063 A1* | 5/2014 | Briffa | H03F 1/0288 330/127 |
| 2014/0273897 A1 | 9/2014 | Drogi et al. | |
| 2015/0015222 A1 | 1/2015 | Ivanov et al. | |
| 2015/0043620 A1 | 2/2015 | Bai et al. | |
| 2015/0097624 A1 | 4/2015 | Olson | |

FOREIGN PATENT DOCUMENTS

| | | |
|---|---|---|
| CN | 1964183 A | 5/2007 |
| CN | 102483984 A | 5/2012 |
| CN | 102812640 A | 12/2012 |
| CN | 102823138 A | 12/2012 |
| CN | 103916083 A | 7/2014 |
| CN | 104052402 A | 9/2014 |
| CN | 104518788 A | 4/2015 |
| WO | 2011156379 A2 | 12/2011 |

OTHER PUBLICATIONS

Zhu, et al., "A High-Speed Self-Biased CMOS Amplifier IP core*," IEEE Int. Workshop VLSI Design & Video Tech., 4 pages, Suzhou, China, May 28-30, 2005.

Wang et al., "Design of a Sub-mW 960-MHz UWB CMOS LNA," IEEE J. Solid-State Circuits, 8 pages, 41:111, Nov. 2006.

Giustolisi, et al., "High-Drive and Linear CMOS Class-AB Pseudo-Differential Amplifier," IEEE Trans.Circuits Syst., 5 pages, 54:2, Feb. 2007.

Song, et al., "A Low-Power 2.4-GHz Current-Reused Receiver Front-End and Frequency Source for Wireless Sensor Network," IEEE J. Solid-State Circuits, 11 pages, 42:5, May 2007.

Figueiredo, et al., "A Two-Stage Fully Differential Inverter-Based Self-Biased CMOS Amplifier with High Efficiency," IEEE Trans. Circuits Syst., 13 pages, 58:7, Jul. 2011.

Taris, et al., "A 60μW LNA for 2.4 GHz Wireless Sensors Network Applications," Radio Frequency Integrated Circuits Symposium (RFIC), IEEE, 4 pages, Jun. 5-7, 2011.

Ayers, James S., "Ultra-Low Power Receivers for Wireless Sensor Networks," Ph.D. dissertation, Oregon State University, May 5, 2010 (111 pages).

Custodio, et al., "A CMOS Inverter-Based Self-biased Fully Differential Amplifier," DoCEIS, IFIP AICT 314, 8 pages, 2010.

(56) References Cited

OTHER PUBLICATIONS

Azizan, et al., "A Review of LNA Topologies for Wireless Applications," 2nd Intl. Conf. on Elect. Design, IEEE, 5 pages, Aug. 19-21, 2014.
International Search Report for Chinese Application No. 2016800388160 mailed Nov. 13, 2020; 5 pages.
International Office Action for Chinese Application No. 2016800388160 mailed Nov. 13, 2020; 10 pages.
Liang Liu; "Research and Design of Radio Frequency Monolithic Voltage Controlled Oscillator in 0.18 CMOS Technology" China Master's Theses Full-text Database, Information Technology Volume; Abstract in English p. 5; Jul. 15, 2012; pp. 135-540.
C. Wen, et al.; "A Phase-Change via-Reconfigurable CMOS LC VCO" IEEE Transactions on Electron Devices, vol. 60, No. 12; Dec. 2013; pp. 3979-3988; 10 pages.

* cited by examiner

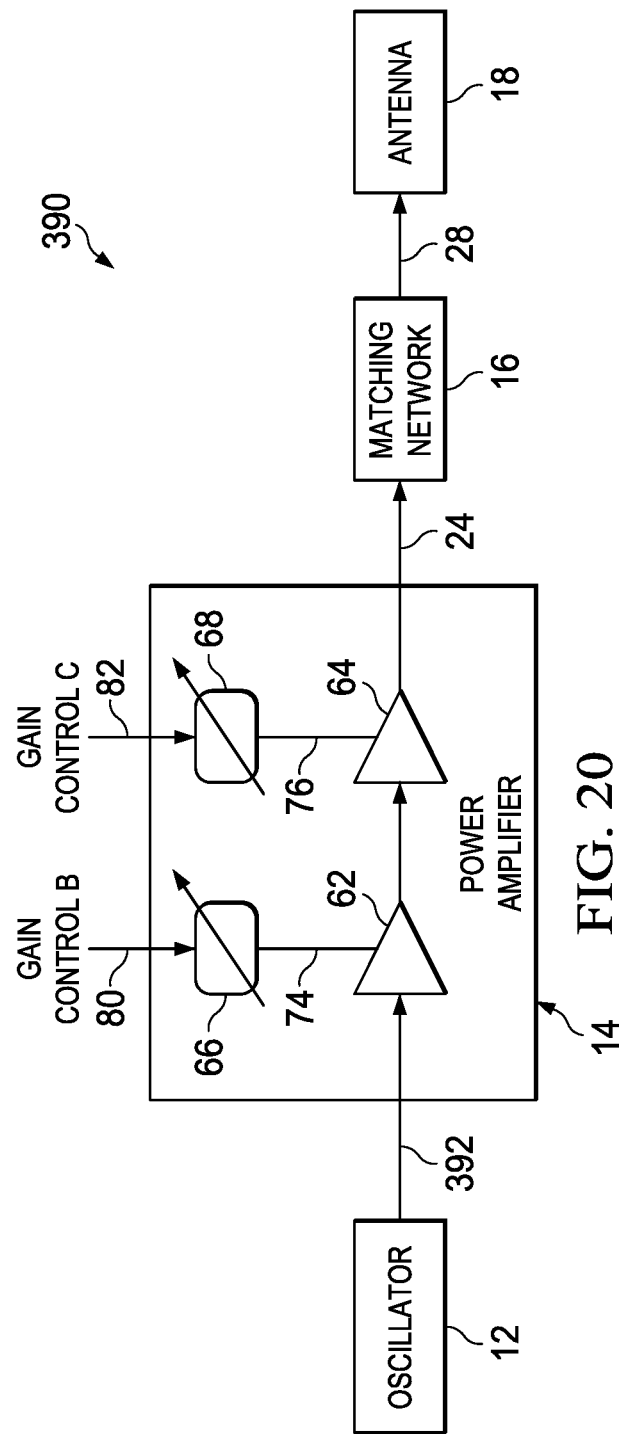

VARIABLE GAIN POWER AMPLIFIERS

RELATED APPLICATIONS

This application is a continuation of U.S. patent application Ser. No. 17/573,662 filed Jan. 12, 2022, which is a continuation of U.S. patent application Ser. No. 17/034,099, filed Sep. 28, 2020, now U.S. Pat. No. 11,258,404, which is a continuation of U.S. patent application Ser. No. 16/710,239, filed Dec. 11, 2019, now U.S. Pat. No. 10,797,646, which is a continuation of U.S. patent application Ser. No. 15/627,249, filed Jun. 19, 2017, now U.S. Pat. No. 10,536,113, which is a continuation of U.S. patent application Ser. No. 14/755,462, filed Jun. 30, 2015, now U.S. Pat. No. 9,685,907, each of which is incorporated herein by reference in its entirety.

TECHNICAL FIELD

The disclosure relates to electrical circuits, and in particular, to power amplifiers.

BACKGROUND

Transceivers are used in a wide variety of applications, such as, for example, mobile telephones, radios, and wireless communication. A transceiver may use a power amplifier to increase the power of a signal driving an antenna so that the power of the signal is strong enough to reach relatively far distances. Many types of transceiver applications may be power-limited and/or area-limited. For example, a mobile phone radio may use a battery with a limited amount of power, and may have a limited amount of space for transceiver components. Designing power amplifiers for low-power, low-area transceivers can present significant challenges.

SUMMARY

According to some aspects of this disclosure, an integrated circuit includes an oscillator and a power amplifier. The oscillator includes a first node, a second node, and a network of one or more reactive components coupled between the first node and the second node. The network of the reactive components has at least one tap between the first and second nodes. The oscillator further includes a first output coupled to the network of the reactive components via the second node, and a second output coupled to the network of the reactive components via the tap. The power amplifier includes a first input coupled to the first output of the oscillator, a second input coupled to the second output of the oscillator, and an output.

According to additional aspects of this disclosure, an integrated circuit includes a voltage-controlled oscillator (VCO) having one or more reactive components. The integrated circuit further includes a programmable passive attenuation circuit coupled to the VCO. The programmable passive attenuation circuit includes at least a portion of the one or more reactive components included in the VCO. The integrated circuit further includes a power amplifier coupled to the programmable passive attenuation circuit.

According to additional aspects of this disclosure, a method includes generating, with a network of one or more reactive components included in voltage-controlled oscillator (VCO), a first oscillating signal. The method further includes outputting, via one or more taps included in the network of the reactive components, a second oscillating signal. The second oscillating signal has a magnitude that is proportional to and less than the first oscillating signal. The method further includes selecting one of the first and second oscillating signals to use for generating a power-amplified output signal based on a gain control. The method further includes generating the power-amplified output signal based on the selected one of the first and second oscillating signals.

BRIEF DESCRIPTION OF THE DRAWINGS

FIGS. 16-20 are block diagrams illustrating additional example transmitters according to this disclosure.

DETAILED DESCRIPTION

Figure 1:
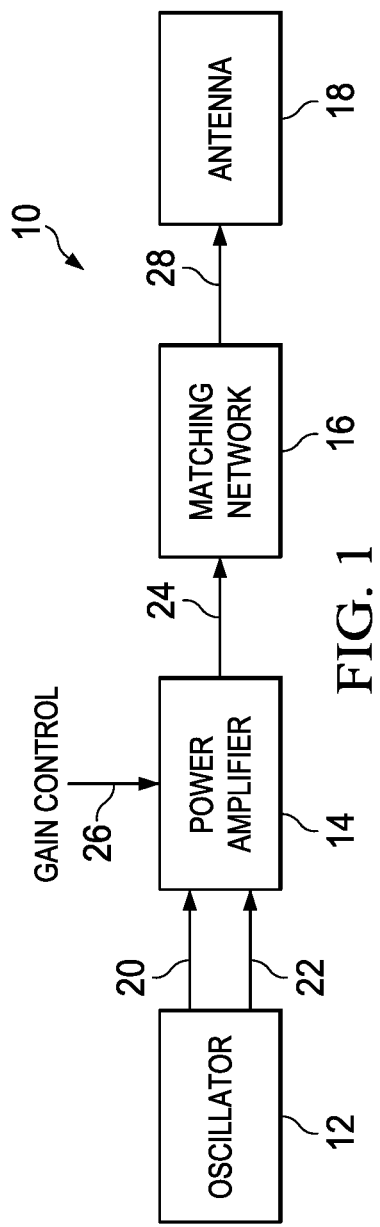
FIG. 1 is a block diagram illustrating an example transmitter according to this disclosure.

This disclosure describes variable-gain power amplifiers that may be used to amplify signals in transmitters and/or transceivers. In some examples, a power amplifier may include an oscillator that includes a network of one or more reactive components. The network of reactive components may include one or more taps that allow the oscillator to output different voltages that occur across different portions of the network of reactive components. A power amplifier may receive the different voltages, and selectively amplify one or more of the different voltages to obtain a power-amplified output signal.

Selectively amplifying different voltages that occur across different portions of a network of reactive components in an oscillator may allow the gain of a power amplifier to be adjusted, which may in turn allow the output power of the amplifier to be adjusted based on dynamic power requirements of a transmitter. Allowing the output power of an amplifier to be adjusted based on the dynamic power requirements of the transmitter may allow the overall power consumption of the transmitter or transceiver to be reduced. By using one or more taps of a network of reactive components included in an oscillator to obtain the different voltages that are selectively amplified, the amount of components needed to obtain the different voltages may be reduced. In this way, a variable gain, relatively low-power amplifier may be obtained with a relatively small number of components.

In some examples, the network of one or more reactive components may include one or more inductors coupled in series. In such examples, a first voltage may be obtained across a first portion of the inductors, and a second voltage may be obtained across a second portion of the inductors. The second portion may be a subset of the first portion. In further examples, the network of reactive components may include one or more capacitors coupled in series. Other examples are also possible and within the scope of this disclosure.

In some examples, to selectively amplify the multiple voltages, the power amplifier may select one of the voltages based on a gain control, and amply the selected voltage using multiple amplifier stages. In further examples, to selectively amplify the multiple voltages, the power amplifier may amplify each of the voltages in a separate amplifier signal chain, and then select one of the amplified voltages based on a gain control.

In some examples, the power amplifier may include multiple gain controls. For example, the power amplifier may include a coarse gain control that controls the selection of which of the oscillator voltages to use for generating the power-amplified output signal, and a fine gain control that controls the gain of one or both of the amplifier stages in a multi-stage amplifier that amplifies the selected oscillator voltage. The fine gain control may, in some examples, provide a continuous gain control function, but the range of gain values over which the gain control function is linear may be relatively small. Meanwhile, the coarse gain control function may be linear over a relatively large range of gain values, but may be a discrete function with discrete gain steps.

Providing both coarse and fine gain control may allow the gain of a power amplifier to be finely tuned over a wide range of gain values. In this way, a power amplifier may be achieved that has relatively high precision gain control over a relatively large range of output power settings.

In some examples, one or more of the amplifier stages in the power amplifier may include a differential, self-biased amplifier. The differential self-biased amplifier may include a first variable resistance coupled between the power supply and the source terminals of one or more pull-up transistors, and a second variable resistance coupled between the ground rail and the source terminals of one or more pull-down transistors.

Increasing the variable resistances may increase the even-order harmonic suppression of the amplifier stage, but decrease the gain of the amplifier stage. Decreasing the variable resistances may have the opposite effect. As such, by positioning variable resistances at the above-described locations in the differential, self-biased amplifier, the tradeoff between even-order harmonic suppression and amplifier gain may be dynamically adjusted and balanced in the power amplifier.

In further examples, one or more of the amplifier stages in the power amplifier may be configurable to operate in a self-biased mode and a non-linear mode. The self-biased mode may provide a greater degree of linearity than the non-linear mode, but may be less power efficient. On the other hand, the non-linear mode may be more power efficient, but provide less linearity. By providing an amplifier stage that is configurable to operate in a self-biased mode and a non-linear mode, the tradeoff between linearity and power efficiency may be dynamically adjusted and balanced in the power amplifier.

In additional examples, the power amplifier may be a multi-stage amplifier where each of the stages includes a single-ended or differential self-biased amplifier. Each of the stages may further include an independently adjustable power rail voltage. Adjusting the power rail voltage for a particular amplifier stage may cause the self-biased amplifier in that stage to bias at a different bias current, which may in turn adjust the gain of the self-biased amplifier. Therefore, by using independently adjustable power rail voltages for the different self-biased amplifier stages, a multi-stage power amplifier with stage-independent gain adjustment may be achieved with a relatively small number of circuit components.

FIG. 1 is a block diagram illustrating an example transmitter 10 according to this disclosure. Transmitter 10 includes an oscillator 12, a power amplifier 14, a matching network 16, an antenna 18, connections 20, 22, 24, 28, and a gain control lead 26. A first output of oscillator 12 is coupled to a first input of power amplifier 14 via connection 20. A second output of oscillator 12 is coupled to a second input of power amplifier 14 via connection 22. A gain control input of power amplifier 14 is coupled to gain control lead 26. An output of power amplifier 14 is coupled to an input of matching network 16 via connection 24. An output of matching network 16 is coupled to an input of antenna 18 via connection 28.

Each of connections 20, 22, 24, 28 may be either a single-ended or a differential connection, and may include one or more leads that form the connection. A single-ended connection may be implemented as a single lead. A differential connection may be implemented with a differential pair of leads.

Oscillator 12 generates a first oscillating signal at the first output of oscillator 12 and a second oscillating signal at the second output of oscillator 12. The second oscillating signal may be an attenuated version of the first oscillating signal. The oscillating signals may be single-ended signals or differential signals. Power amplifier 14 receives the oscillating signals at the first and second inputs of power amplifier 14, respectively, and generates a power-amplified output signal at the output of power amplifier 14 based on the oscillating signals. To generate the power-amplified output signal, power amplifier 14 may select one of the oscillating signals, generate an amplified version of the selected one of the oscillating signals, and output the amplified version of the selected one of the oscillating signals as the power-amplified output signal. Power amplifier 14 may generate the amplified version of the selected one of the oscillating signals with a gain that is determined based on the gain control signal received at the gain control input of power amplifier 14. Matching network 16 receives the power-amplified output signal at the input of matching network 16, and transforms the power-amplified output signal to generate the transformed-power-amplified output signal at the output of matching network 16. Matching network 16 may have an input impedance that is designed to substantially match the output impedance of power amplifier 14, and an output impedance that substantially matches the impedance of antenna 18. Antenna 18 receives the transformed-power-amplified output signal from matching network 16, and radiates the signal as electromagnetic radiation.

To generate the oscillating signals at the first and second outputs of oscillator 12, oscillator 12 may include a network of one or more reactive components, referred to herein as a reactive component network. The reactive component network may have a first node connected to a first end of the network, a second node connected to a second end of the network, and one or more taps connected at respective locations between the first and second nodes.

In some examples, oscillator 12 may generate the first oscillating signal based on voltages at one or both of the first and second nodes, and generate the second oscillating signal based on voltages at one or more of the taps. In examples where the oscillating signals are differential signals, the reactive component network may have at least two taps located at two different locations between the first and second node. In such examples, the first oscillating signal may correspond to a voltage between the first and second nodes, and the second oscillating signal may correspond to a voltage between the first and second taps.

The reactive component network may include one or more reactive components (e.g., inductors or capacitors). If the reactive component network contains more than one reactive component, the reactive components may be coupled in series. In either case, the portion of the one or more reactive components between the first and second taps may be a subset of the portion of the reactive components between the first and second nodes. Thus, the reactance (e.g., inductance or capacitance) between the first and second taps may be less than the reactance between the first and second nodes. Accordingly, the second oscillating signal, which corresponds to the voltage taken between the first and second taps, may be an attenuated version of the first oscillating signal, which corresponds to the voltage taken between the first and second nodes. The second oscillating signal may be an attenuated version of the first oscillating signal in the sense that the amplitude of the second oscillating signal is proportional to, but less than, the first oscillating signal.

In examples where the oscillating signals are single-ended signals, the first oscillating signal may, in some examples, correspond to a voltage between one of the nodes of oscillator 12 and a reference voltage, and the second oscillating signal may, in such examples, correspond to a voltage between one of the taps of oscillator 12 and the reference voltage. In some examples, the first node may be coupled to a ground rail or a power rail and serve as a reference voltage. In such examples, the first oscillating signal may, in some examples, correspond to a voltage between the first node and the second node, and the second oscillating signal may, in such examples, correspond to a voltage between one of the taps and the first node.

The portion of the one or more reactive components between the tap and the first node may be a subset of the portion of the reactive components between the first and second nodes. Thus, the reactance (e.g., inductance or capacitance) between the tap and the first node may be less than the reactance between the first and second nodes. Accordingly, the second oscillating signal, which corresponds to the voltage taken between the tap and the first node, may be an attenuated version of the first oscillating signal, which corresponds to the voltage taken between the first and second nodes.

Oscillator 12 may generate the first and second oscillating signals based on a control signal. For example, oscillator 12 may be a voltage-controlled oscillator (VCO), and the control signal may be a voltage signal. In some cases, transmitter 10 may generate the control signal based on data to be transmitted. In such examples, oscillator 12 may use the control signal to frequency modulate and/or phase modulate the oscillating signals at the first and second outputs of oscillator 12 based on the data to be transmitted. In other words, in such examples, each of the oscillating signals may be frequency-modulated (FM) or phase-modulated (PM) signal. In some examples, the oscillating signals may be voltage signals.

In some examples, power amplifier 14 may include a single amplifier signal chain. In such examples, to generate the power-amplified output signal, power amplifier 14 may select one of the oscillating signals, amplify the selected one of the oscillating signals with the single amplifier signal chain, and output the amplified version of the selected one of the oscillating signals as the power-amplified output signal.

In further examples, power amplifier 14 may include multiple amplifier signal chains. In such examples, to generate the power-amplified output signal, power amplifier 14 may amplify each of the oscillating signals with a respective amplifier signal chain, and select one of the amplified versions of the oscillating signals to output as the power-amplified output signal.

The gain control signal may control the gain of power amplifier 14. In some examples, power amplifier 14 may include a selection unit that selects one of the oscillating signals output by oscillator 12 or an amplified version of one of the oscillating signals to use in generating the power-amplified output signal. In such examples, the gain control signal may be coupled to a control input of the selection unit, and the selection unit may select one of the signals based on the gain control signal.

In some examples, the gain control signal may include multiple signal components. For example, the gain control signal may include a first gain control signal component and a second gain control signal component. The first gain control signal component may be coupled to the control input of a selection unit and control the gain (e.g., attenuation) provided by the selection unit, and the second gain control signal component may be coupled to one or more amplifier stages in power amplifier 14 and control the gain provided by the one or more amplifier stages.

Power amplifier 14 may be either a single stage amplifier or a multi-stage amplifier. A single stage amplifier may have a single amplifier stage, and a multi-stage amplifier may have multiple amplifier stages. In examples where power amplifier 14 is a multi-stage amplifier and the gain control signal includes a gain control signal component that is coupled to the amplifier stages, the gain control signal component may include multiple gain control signal subcomponents that are each coupled to respective stages of the multi-stage amplifier. Each of the gain control signal subcomponents may adjust and control the gain of a respective one of the stages in the multi-stage amplifier. In such examples, the gain of each of the gain stages in the multi-stage amplifier may be independently adjusted.

In examples where power amplifier 14 includes multiple amplifier signal chains, each of the amplifier signal chains may be either a single stage amplifier signal chain or a multi-stage amplifier signal chain. In examples where the multiple amplifier signal chains are multi-stage amplifier signal chains, corresponding amplifier stages in each of the amplifier signal chains may, in some examples, be controlled based on the same gain control signal subcomponent of the gain control signal. In other examples, the gain of corresponding amplifier stages may be independently programmable.

In additional examples, power amplifier 14 may be a multi-stage amplifier where each of the stages includes a single-ended or differential self-biased amplifier. Each of the stages may further have an independently adjustable power rail voltage. Adjusting the power rail voltage for a particular amplifier stage may cause the self-biased amplifier in that stage to bias at a different bias current, which may in turn adjust the gain of the self-biased amplifier. Therefore, by using independently adjustable power rail voltages for the different self-biased amplifier stages, a multi-stage power amplifier with stage-independent gain adjustment may be achieved with a relatively small number of circuit components.

In some examples, the adjustable power rail voltages may be supplied by one or more adjustable power supplies. For example, the adjustable power supplies may be adjustable voltage regulators, such as, e.g., adjustable low-dropout regulators (LDOs). A voltage regulator and/or LDO may be adjustable in the sense that the regulator and/or LDO may output a voltage level that is determined based on a control input.

In examples where one or more of the amplifier stages in power amplifier 14 are powered by one or more adjustable power supplies, the control inputs for each of the adjustable power supplies may be coupled to respective gain control signal subcomponents of the gain control signal. In such examples, the amplifier stages may be configured to have gains that are determined based on the power supply output level (e.g., voltage level).

In examples where the gain control signal includes multiple signal components, power amplifier 14 may be said to include multiple gain controls. For example, power amplifier 14 may include a coarse gain control that controls the selection of which of the oscillating signals to use for generating the power-amplified output signal, and a fine gain control that controls the gain of one or more of the amplifier stages in a multi-stage amplifier that amplifies the selected oscillator voltage. The fine gain control may, in some examples, provide a continuous gain control function, but the range of gain values over which the gain control function is linear may be relatively small. Meanwhile, the coarse gain control function may be linear over a relatively large range of gain values, but may be a discrete function with discrete gain steps.

Providing both coarse and fine gain control may allow the gain of power amplifier 14 to be finely tuned over a wide range of gain values. In this way, a power amplifier may be achieved that has relatively high precision gain control over a relatively large range of output power settings.

In some examples, one or more of the amplifier stages in power amplifier 14 may be a differential, self-biased amplifier stage. The differential self-biased amplifier stage may include a first variable resistance coupled between the power supply and the source terminals of one or more pull-up transistors, and a second variable resistance coupled between the ground rail and the source terminals of one or more pull-down transistors.

Increasing the variable resistances may increase the even-order harmonic suppression of the amplifier stage, but decrease the gain of the amplifier stage. Decreasing the variable resistances may have the opposite effect. As such, by positioning variable resistances at the above-described locations in the differential, self-biased amplifier, the tradeoff between even-order harmonic suppression and amplifier gain may be dynamically adjusted and balanced in power amplifier 14.

In some examples, power amplifier 14 may include a differential, self-biased amplifier stage with one or more variable resistances as described in the previous example where the amplifier stage is also powered by an adjustable power supply (e.g., an adjustable LDO). In such examples, a coarse gain control may be coupled to the variable resistances and a fine gain control may be coupled to the adjustable power supply.

In further examples, one or more of the amplifier stages in power amplifier 14 may be configurable to operate in a self-biased mode and a non-linear mode. The self-biased mode may provide a greater degree of linearity than the non-linear mode, but may be less power efficient. On the other hand, the non-linear mode may be more power efficient, but provide less linearity. By providing an amplifier stage that may be configurable to operate in a self-biased mode and a non-linear mode, the tradeoff between linearity and power efficiency may be dynamically adjusted and balanced in power amplifier 14.

Matching network 16 may include any components that are configured to provide impedance matching between the power amplifier 14 and antenna 18. In some examples, matching network 16 may include one or more inductors or capacitors configured to cause the output impedance of matching network 16 to match the impedance of antenna 18, and to cause the input impedance of matching network 16 to match the output impedance of power amplifier 14. Antenna 18 may be any type of antenna that is configured to transmit electromagnetic signals to a remote device.

Power amplifier 14 may selectively amplify the oscillating signals output by oscillator 12 to generate a power-amplified output signal. Each of the oscillating signals may correspond to a different voltage that occurs across a different portion of a network of reactive components included in oscillator 12. Selectively amplifying different voltages that occur across different portions of a network of reactive components oscillator 12 may allow the gain of power amplifier 14 to be adjusted, which may in turn allow the output power of power amplifier 14 to be adjusted based on dynamic power requirements of transmitter 10. Allowing the output power of power amplifier 14 to be adjusted based on dynamic power requirements may allow the overall power consumption of power amplifier 14 to be reduced. By using one or more taps of a network of reactive components included in oscillator 12 to obtain the different voltages that are selectively amplified by power amplifier 14, the amount of components needed to obtain the different voltages may be reduced. In this way, a variable gain, relatively low-power amplifier may be obtained with a relatively small number of components.

Figure 2:
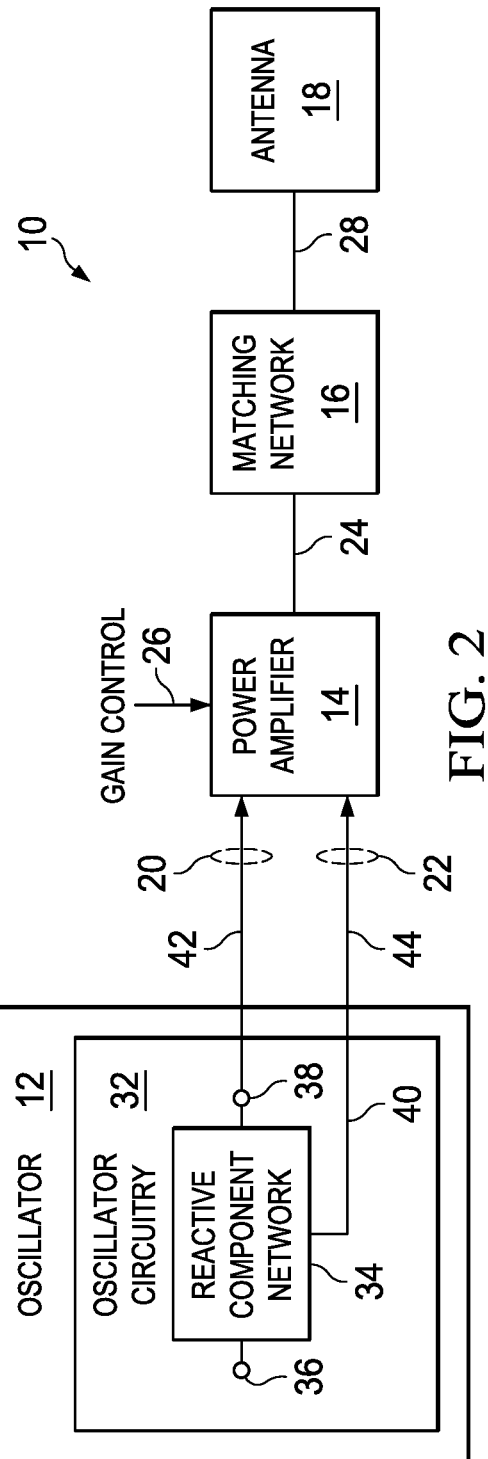
FIGS. 2 and 3 are block diagrams of the example transmitter of FIG. 1 in which example oscillators are illustrated in further detail according to this disclosure.

FIG. 2 is a block diagram of the example transmitter 10 of FIG. 1 in which an example oscillator 12 is illustrated in further detail according to this disclosure. In FIG. 2, the first and second outputs of oscillator 12 are single-ended outputs that generate single-ended output signals. Oscillator 12 includes oscillator circuitry 32, which includes a reactive component network 34. Reactive component network 34 includes a node 36 connected to a first end of reactive component network 34 and a node 38 connected to the second end of reactive component network 34. Reactive component network 34 also includes a tap 40 that is coupled to the reactive components in reactive component network 34 between the first and second ends of reactive component network 34.

Node 38 is coupled to the first input of power amplifier 14 via lead 42, and tap 40 is coupled to the second input of power amplifier 14 via lead 44. Node 38 may be coupled to and/or form the first output of oscillator 12, and tap 40 may be coupled to and/or form the second output of oscillator 12. Leads 42, 44 in FIG. 2 may correspond, respectively, to connections 20, 22 in FIG. 1.

During operation, oscillator 12 generates a first oscillating signal at the first output of oscillator 12 and a second oscillating signal at the second output of oscillator 12. The second oscillating signal may be an attenuated version of the first oscillating signal. In some examples, the first oscillating signal may correspond to a voltage between node 38 and a reference voltage, and the second oscillating signal may correspond to a voltage between tap 40 and the reference voltage. In further examples, node 36 may be coupled to a ground rail or a power rail and serve as a reference voltage. In such examples, the first oscillating signal may correspond to a voltage between node 36 and node 38, and the second oscillating signal may correspond to a voltage between tap 40 and node 36.

In some examples, transmitter 10 of FIG. 2 may be implemented on an integrated circuit. The integrated circuit may include an oscillator 12 having a node 36, a node 38, and a reactive component network 34 (i.e., a network of one or more reactive components) coupled between node 36 and node 38. The reactive component network 34 may have at least one tap 40 between node 36 and node 38. Oscillator 12 may further include a first output coupled to reactive component network 34 via node 38, and a second output coupled to reactive component network 34 via tap 40. The integrated circuit may further include a power amplifier 14 having a first input coupled to the first output of oscillator 12, and a second input coupled to the second output of oscillator 12, and an output.

In some examples, node 36 of oscillator 12 is at least one of a power rail or a ground rail for oscillator 12. In such examples, reactive component network 34 includes, in some examples, one or more inductors coupled in series between node 36 and node 38 of oscillator 12. In such examples, tap 40 is coupled to the one or more inductors, and an inductance between node 36 and node 38 of oscillator 12 is greater than an inductance between tap 40 of reactive component network 34 and node 36 of oscillator 12.

In additional examples where node 36 of oscillator 12 is at least one of a power rail or a ground rail for oscillator 12, reactive component network 34 includes one or more capacitors coupled in series between node 36 and node 38 of oscillator 12. In such examples, tap 40 is coupled to the one or more capacitors, and a capacitance between node 36 and node 38 of oscillator 12 is greater than a capacitance between tap 40 of reactive component network 34 and node 36 of oscillator 12.

Figure 3:
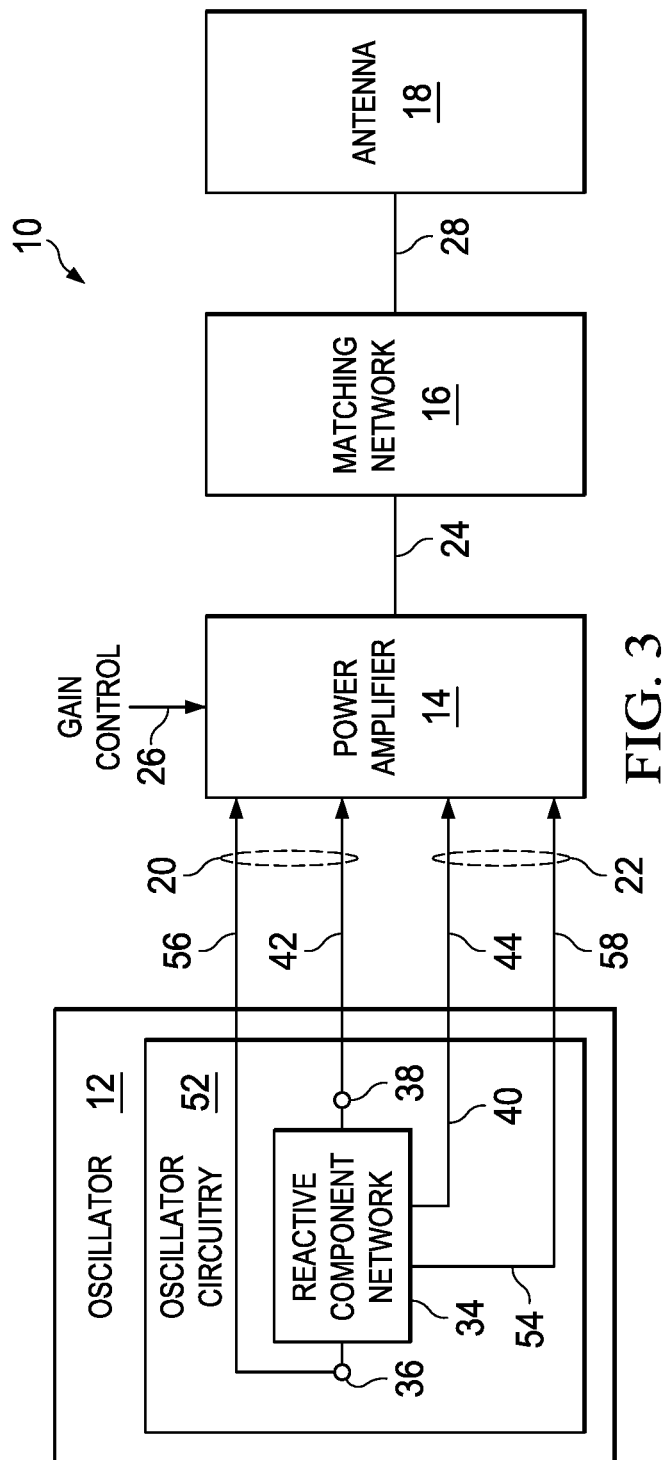

FIG. 3 is a block diagram of the example transmitter 10 of FIG. 1 in which another example oscillator 12 is illustrated in further detail according to this disclosure. As shown in FIG. 3, oscillator 12 includes oscillator circuitry 52 that is similar to oscillator circuitry 32 of FIG. 2 except that: (1) node 36 is coupled to power amplifier 14 via lead 56, (2) reactive component network 34 includes an additional tap 54 between nodes 36, 38, and (3) tap 54 is coupled to power amplifier 14 via lead 58. Same or similar components between oscillator circuitry 32 of FIG. 2 and oscillator circuitry 52 of FIG. 3 have been numbered with identical reference numerals.

In FIG. 3, the first and second outputs of oscillator 12 are differential outputs that generate differential output signals. Specifically, nodes 36, 38 may form a first differential output, and taps 40, 54 may form a second differential output. Similarly, the first and second inputs of power amplifier 14 may be differential inputs. The first differential output of oscillator 12 is coupled to the first differential input of power amplifier 14 via leads 42, 56. The second differential output of oscillator 12 is coupled to the second differential input of power amplifier 14 via leads 44, 58. Leads 42, 56 in FIG. 3 may collectively correspond to connection 20 in FIG. 1. Similarly, leads 44, 58 in FIG. 3 may collectively correspond to connection 22 in FIG. 1.

During operation, oscillator 12 generates a first differential oscillating signal at the first output of oscillator 12 and a second differential oscillating signal at the second output of oscillator 12. The second differential oscillating signal may be an attenuated version of the first differential oscillating signal. The first differential oscillating signal may correspond to a voltage between node 36 and node 38, and the second differential oscillating signal may correspond to a voltage between tap 54 and tap 40 of reactive component network 34.

In some examples, transmitter 10 of FIG. 3 may be implemented on an integrated circuit. The integrated circuit may include an oscillator 12 having a node 36, a node 38, and a reactive component network 34 coupled between node 36 and node 38. Reactive component network 34 may have taps 40, 54 between node 36 and node 38. Oscillator 12 may further include a first output coupled to reactive component network 34 via nodes 36, 38, and a second output coupled to reactive component network 34 via taps 40, 54. The integrated circuit may further include a power amplifier 14 having a first input coupled to the first output of oscillator 12, a second input coupled to the second output of oscillator 12, and an output.

In some examples, reactive component network 34 may have taps 40, 54 coupled between node 36 and node 38. In such examples, the first output of oscillator 12 is a first differential output having a first terminal coupled to reactive component network 34 via node 36, and a second terminal coupled to reactive component network 34 via node 38. In such examples, the second output of the VCO is a second differential output having a first terminal coupled to reactive component network 34 via tap 54, and a second terminal coupled to reactive component network 34 via tap 40.

In further examples, reactive component network 34 includes one or more inductors coupled in series between node 36 and node 38 of oscillator 12, and taps 40, 54 are coupled to the one or more inductors. In such examples, an inductance between the first and second terminals of the first differential output of oscillator 12 is greater than an inductance between the first and second terminals of the second differential output of oscillator 12.

In additional examples, reactive component network 34 includes one or more capacitors coupled in series between node 36 and node 38 of oscillator 12, and taps 40, 54 are coupled to the one or more capacitors. In such examples, a capacitance between the first and second terminals of the first differential output of oscillator 12 is greater than a capacitance between the first and second terminals of the second differential output of oscillator 12.

In the transmitters 10 of FIGS. 2 and 3, oscillator 12 may output multiple oscillating signals, and power amplifier 14 may selectively amplify the oscillating signals to generate the power-amplified output signal. Each of the oscillating signals may correspond to a different voltage that occurs across a different portion of a network of reactive components included in oscillator 12. Selectively amplifying different voltages that occur across different portions of a network of reactive components in oscillator 12 may allow the gain of power amplifier 14 to be adjusted, which may in turn allow the output power of power amplifier 14 to be adjusted based on dynamic power requirements of transmitter 10. Allowing the output power of power amplifier 14 to be adjusted based on dynamic power requirements may allow the overall power consumption of power amplifier 14 to be reduced. By using one or more taps of a network of reactive components included in oscillator 12 to obtain the different voltages that are selectively amplified by power amplifier 14, the amount of components needed to obtain the different voltages may be reduced. In this way, a variable gain, relatively low-power amplifier may be obtained with a relatively small number of components.

Figure 4:
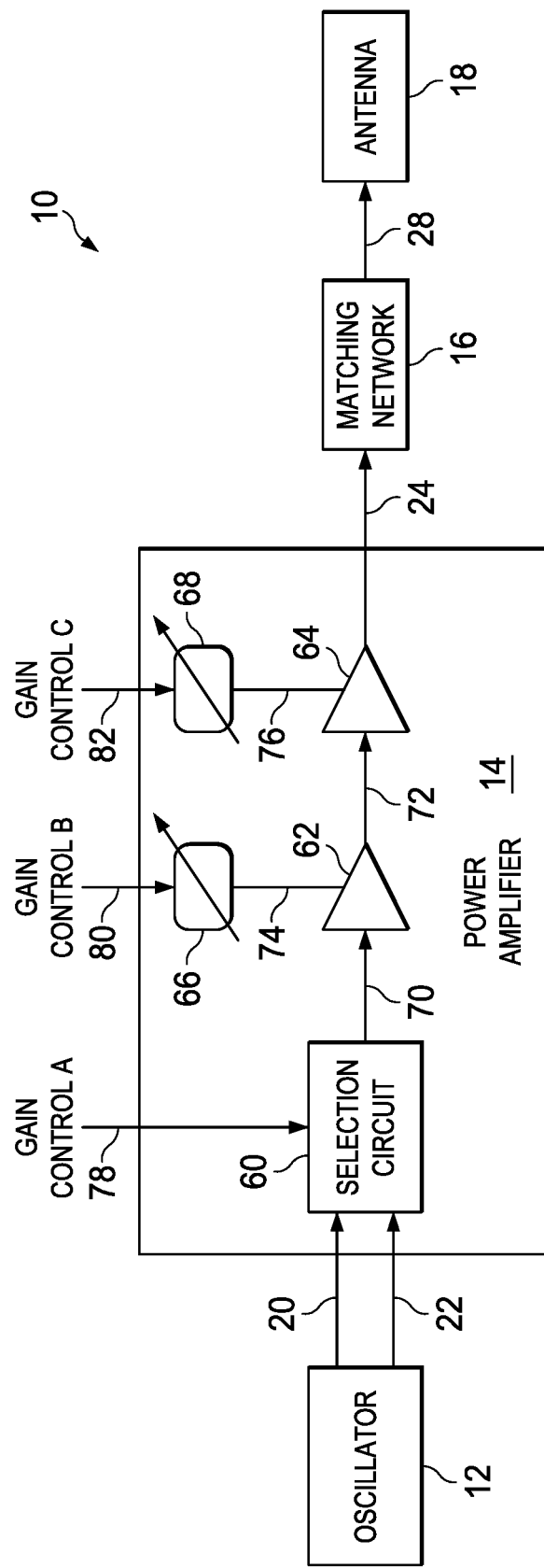
FIGS. 4 and 5 are block diagrams of the example transmitter of FIG. 1 in which example power amplifiers are illustrated in further detail according to this disclosure.

FIG. 4 is a block diagram of the example transmitter 10 of FIG. 1 in which an example power amplifier 14 is illustrated in further detail according to this disclosure. Power amplifier 14 includes a selection circuit 60, amplifier stages 62, 64, adjustable power sources 66, 68, connections 70, 72, power lines 74, 76, and gain control leads 78, 80, 82. A first input of selection circuit 60 is coupled to the first output of oscillator 12 via connection 20. A second input of selection circuit 60 is coupled to the second output of oscillator 12 via connection 22. An output of selection circuit 60 is coupled to an input of amplifier stage 62 via connection 70. An output of amplifier stage 62 is coupled to an input of amplifier stage 64 via connection 72. An output of amplifier stage 64 is coupled to the input of matching network 16 via connection 24.

The output of amplifier stage 64 may be coupled to and/or form the output of power amplifier 14. The first and second inputs of selection circuit 60 may be coupled to and/or form, respectively, the first and second inputs of power amplifier 14.

An output of adjustable power source 66 is coupled to a power input of amplifier stage 62 via power line 74. An output of adjustable power source 68 is coupled to a power input of amplifier stage 64 via power line 76. A control input of selection circuit 60 is coupled to a gain control A lead 78. A control input of amplifier stage 62 is coupled to a gain control B lead 80. A control input of amplifier stage 64 is coupled to a gain control C lead 82. Gain control leads 78, 80, 82 may collectively correspond to gain control lead 26 illustrated in FIGS. 1-3.

Connections 20, 22, 24, 28, 70, 72 may be single-ended or differential connections. When connections 20, 22 are single-ended connections, oscillator 12 may, in some examples, correspond to oscillator 12 in FIG. 2, and connections 20, 22 may correspond to leads 42, 44 of FIG. 2. When oscillator 12 connections 20, 22 are differential connections, oscillator 12 may, in some examples, correspond to oscillator 12 in FIG. 3, and connections 20, 22 may correspond to leads 42, 44, 56, 58 of FIG. 3.

During operation, selection circuit 60 receives oscillating signals from oscillator 12 via connections 20, 22, respectively, selects one of the oscillating signals to use for generating the power-amplified signal based on the gain control A signal, and outputs the selected signal on connection 70. Amplifier stage 62 receives the selected signal via connection 70, amplifies the selected signal with a gain that is determined by the gain control B signal, and outputs the amplified signal on connection 72. Amplifier stage 64 receives the amplified signal from amplifier stage 62 via connection 72, amplifies the signal with a gain that is determined by the gain control C signal, and outputs the amplified signal as the powered-amplified signal for power amplifier 14 at connection 24.

Adjustable power source 66 may power amplifier stage 62 via power line 74. Similarly, adjustable power source 68 may power amplifier stage 64 via power line 76. Adjustable power source 66 may generate an output power level (e.g., voltage level) based on the gain control B signal, and adjustable power source 68 may generate an output power level (e.g., voltage level) based on the gain control C signal. In some examples, one or both of adjustable power sources 66, 68 may be an adjustable voltage regulator, such as, e.g., an adjustable LDO. Amplifier stage 62 may amplify the selected signal based on a gain that is determined by the output power level produced by adjustable power source 66. Amplifier stage 64 may amplify the input signal of amplifier stage 64 based on a gain that is determined by the output power level produced by adjustable power source 68.

As shown in FIG. 4, power amplifier 14 includes a selection circuit 60 having: (1) a first input coupled to the first input of power amplifier 14, (2) a second input coupled to the second input of power amplifier 14, and (3) an output. Power amplifier 14 further includes an amplifier stage 62 having: (1) an input coupled to the output of selection circuit 60, and (2) an output. Power amplifier 14 further includes an amplifier stage 64 having: (1) an input coupled to the output of amplifier stage 62, and (2) an output. Selection circuit 60 has a control input coupled to gain control A lead 78.

Amplifier stages 62, 64 may be implemented with any combination of the amplifier stages described in this disclosure or with other types of amplifier stages. In some examples, amplifier stage 62 may be implemented with the amplifier stage illustrated in FIG. 13, and amplifier stage 64 may be implemented with the amplifier stage illustrated in FIG. 14.

In some examples, each of the amplifier stages 62, 64 in power amplifier 14 may include a single-ended or differential self-biased amplifier (e.g., a self-biased inverter). Each of the amplifier stages 62, 64 may further have an independently adjustable power rail voltage that is provided, respectively, by adjustable power sources 66, 68. Adjusting the power rail voltage for a particular amplifier stage may cause the self-biased amplifier in that stage to bias at a different bias current, which may in turn adjust the gain of the self-biased amplifier. Therefore, by using independently adjustable power rail voltages for the different self-biased amplifier stages, a multi-stage power amplifier with stage-independent gain adjustment may be achieved with a relatively small number of circuit components.

In some examples, the gain control A signal may be a coarse gain control that controls the selection of which of the oscillator voltages to use for generating the power-amplified output signal. In such examples, the gain control B signal and the gain control C signal may collectively form a fine gain control that controls the gain of amplifier stages 62, 64 in multi-stage power amplifier 14. The fine gain control may, in some examples, provide a continuous gain control function, but the range of gain values over which the gain control function is linear may be relatively small. Meanwhile, the coarse gain control function may be linear over a relatively large range of gain values, but may be a discrete function with discrete gain steps.

Providing both coarse and fine gain control may allow the gain of a power amplifier to be finely tuned over a wide range of gain values. In this way, a power amplifier may be achieved that has relatively high precision gain control over a relatively large range of output power settings.

Figure 5:
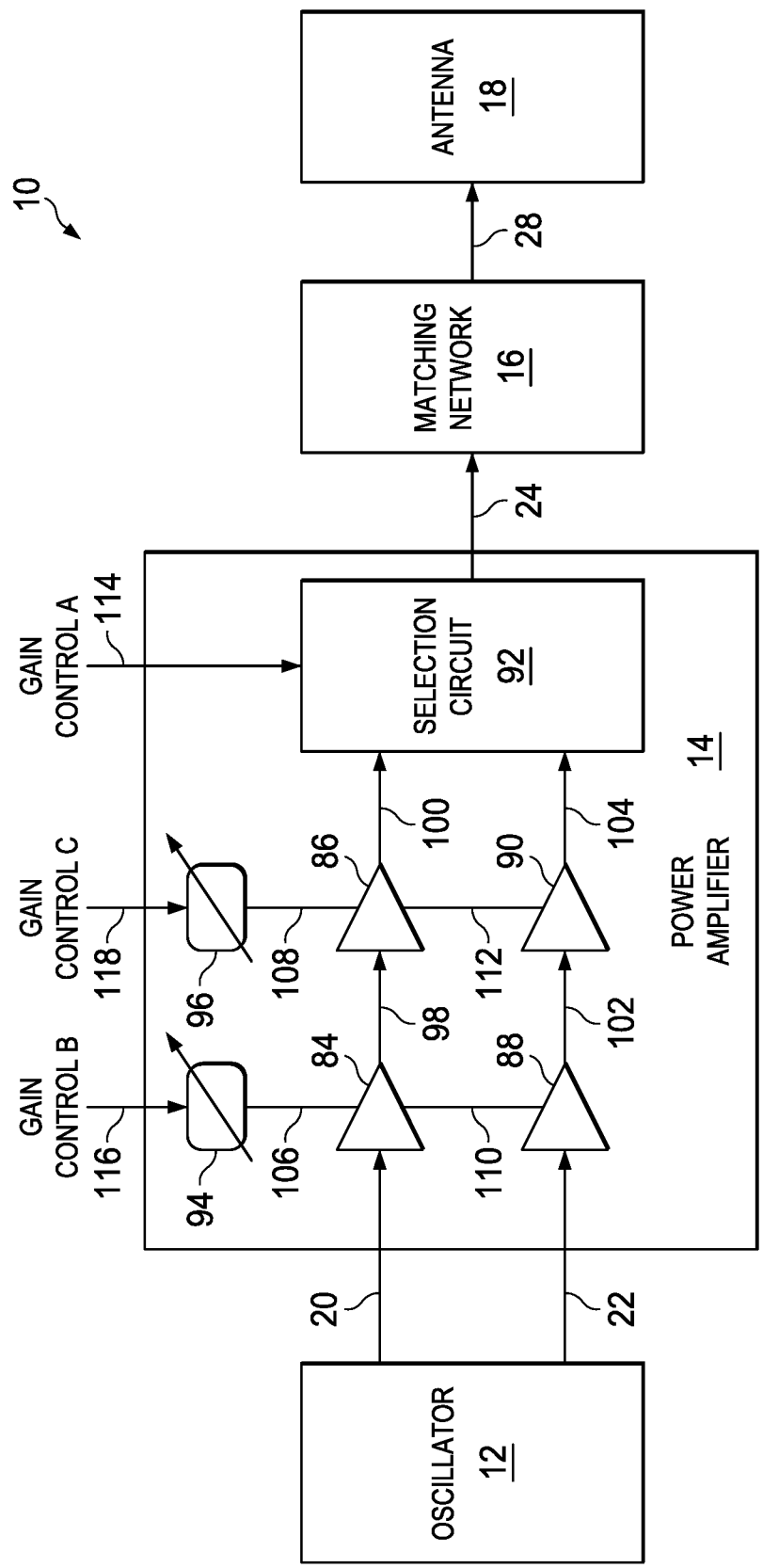

FIG. 5 is a block diagram of the example transmitter 10 of FIG. 1 in which another example power amplifier 14 is illustrated in further detail according to this disclosure. Power amplifier 14 includes amplifier stages 84, 86, 88, 90, a selection circuit 92, adjustable power sources 94, 96, connections 98, 100, 102, 104, power lines 106, 108, 110, 112, and gain control leads 114, 116, 118.

An input of amplifier stage 84 is coupled to the first output of oscillator 12 via connection 20. An output of amplifier stage 84 is coupled to an input of amplifier stage 86 via connection 98. An output of amplifier stage 86 is coupled to a first input of selection circuit 92 via connection 100. An input of amplifier stage 88 is coupled to the second output of oscillator 12 via connection 22. An output of amplifier stage 88 is coupled to an input of amplifier stage 90 via connection 102. An output of amplifier stage 90 is coupled to a second input of selection circuit 92 via connection 104. An output of selection circuit 92 is coupled to the input of matching network 16 via connection 24.

The output of selection circuit 92 may be coupled to and/or form the output of power amplifier 14. The input of amplifier stage 84 may be coupled to and/or form the first input of power amplifier 14. Similarly, the input of amplifier stage 88 may be coupled to and/or form the second input of power amplifier 14.

An output of adjustable power source 94 is coupled to a power input of amplifier stage 84 via power line 106. The output of adjustable power source 94 is also coupled to a power input of amplifier stage 88 via power lines 106, 110. An output of adjustable power source 96 is coupled to a power input of amplifier stage 86 via power line 108. The output of adjustable power source 96 is also coupled to a power input of amplifier stage 90 via power lines 108, 112. A control input of selection circuit 92 is coupled to a gain control A lead 114. A control input of adjustable power source 94 is coupled to a gain control B lead 116. A control input of adjustable power source 96 is coupled to a gain control C lead 118. Gain control leads 114, 116, 118 may collectively correspond to gain control lead 26 illustrated in FIGS. 1-3.

Connections 20, 22, 24, 28, 98, 100, 102, 104 may be single-ended or differential connections. When connections 20, 22 are single-ended connections, oscillator 12 may, in some examples, correspond to oscillator 12 in FIG. 2, and connections 20, 22 may correspond to leads 42, 44 of FIG. 2. When oscillator 12 connections 20, 22 are differential connections, oscillator 12 may, in some examples, correspond to oscillator 12 in FIG. 3, and connections 20, 22 may correspond to leads 42, 44, 56, 58 of FIG. 3.

During operation, amplifier stage 84 receives a first oscillating signal via the first input, amplifies the first oscillating signal to generate a first amplified signal, and outputs the first amplified signal via connection 98. Amplifier stage 86 receives the first amplified signal via connection 98, amplifies the first amplified signal to generate a second amplified signal, and outputs the second amplified signal via connection 100. Amplifier stage 86 receives the second oscillating signal via the second input, amplifies the second oscillating signal to generate a third amplified signal, and outputs the third amplified signal via connection 102. Amplifier stage 86 receives the first amplified signal via connection 102, amplifies the third amplified signal to generate a fourth amplified signal, and outputs the fourth amplified signal via connection 104. Selection circuit 92 receives the third and fourth amplified signals via connection 100 and connection 104, respectively, selects one of the third and fourth amplified signals to use for generating the power-amplified signal based on the gain control A signal, and outputs the selected signal via connection 24.

Amplifier stages 84, 86 may form a first amplifier signal chain, and amplifier stages 88, 90 may form a second amplifier signal chain. The first amplifier signal chain may amplify the oscillating signal received at connection 20, the second amplifier signal chain may amplify the oscillating signal received at connection 22, and selection circuit 92 may select which of the amplified signals to output as the power-amplified signal.

Adjustable power source 94 may power amplifier stages 84, 88 via power lines 106, 110. Similarly, adjustable power source 96 may power amplifier stages 86, 90 via power lines 108, 112. Adjustable power source 94 may generate an output power level (e.g., voltage level) based on the gain control B signal, and adjustable power source 96 may generate an output power level (e.g., voltage level) based on the gain control C signal. In some examples, one or more of adjustable power sources 94, 96 may be an adjustable and/or programmable voltage regulator, such as, e.g., an adjustable and/or programmable LDO. Amplifier stages 84, 88 may amplify their respective input signals based on a gain that is determined by the output power level produced by adjustable power source 94. Similarly, amplifier stages 86, 90 may amplify their respective input signals based on a gain that is determined by the output power level produced by adjustable power source 96.

As shown in FIG. 5, power amplifier 14 includes a first signal chain having amplifier stages 84, 86. Amplifier stage 84 has: (1) an input coupled to the first input of power amplifier 14, and (2) an output. Amplifier stage 86 has: (1) an input coupled to the output of amplifier stage 84 of the first signal chain, and (2) an output. Power amplifier 14 further includes a second signal chain having amplifier stages 88, 90. Amplifier stage 88 has: (1) an input coupled to the second input of the power amplifier, and (2) an output. Amplifier stage 90 has: (1) an input coupled to the output of first amplifier stage 88 of the second signal chain, and (2) an output.

Power amplifier 14 further includes a selection circuit 92 having: (1) a first input coupled to the output of the amplifier stage 86 of the first signal chain, (2) a second input coupled to the output of the amplifier stage 90 of the second signal chain, and (3) an output that forms the output of power amplifier 14. Selection circuit 92 has a control input coupled to gain control A lead 114.

Amplifier stages 84, 86, 88, 90 may be implemented with any combination of the amplifier stages described in this disclosure or with other amplifier stages. In some examples, amplifier stages 84, 88 may be implemented with the amplifier stage illustrated in FIG. 13, and amplifier stages 86, 90 may be implemented with the amplifier stage illustrated in FIG. 14.

In some examples, each of amplifier stages 84, 86, 88, 90 in power amplifier 14 may include a single-ended or differential self-biased amplifier (e.g., a self-biased inverter). Each of amplifier stages 84, 86, 88, 90 may further have an independently adjustable power rail voltage that is provided by adjustable power sources 94, 96. Adjusting the power rail voltage for a particular amplifier stage may cause the self-biased amplifier in that stage to bias at a different bias current, which may in turn adjust the gain of the self-biased amplifier. Therefore, by using independently adjustable power rail voltages for the different self-biased amplifier stages, a multi-stage power amplifier with stage-independent gain adjustment may be achieved with a relatively small number of circuit components.

In some examples, the gain control A signal may be a coarse gain control that controls the selection of which of the oscillator voltages to use for generating the power-amplified output signal. In such examples, the gain control B signal and the gain control C signal may collectively form a fine gain control that controls the gain of amplifier stages 84, 86, 88, 90 in the multi-stage power amplifier 14. The fine gain control may, in some examples, provide a continuous gain control function, but the range of gain values over which the gain control function is linear may be relatively small. Meanwhile, the coarse gain control function may be linear over a relatively large range of gain values, but may be a discrete function with discrete gain steps.

Providing both coarse and fine gain control may allow the gain of a power amplifier to be finely tuned over a wide range of gain values. In this way, a power amplifier may be achieved that has relatively high precision gain control over a relatively large range of output power settings.

Figure 6:
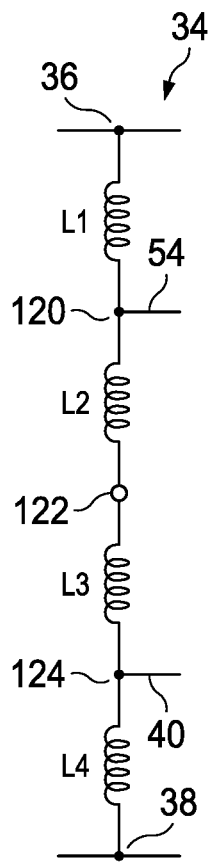
FIG. 6 is a schematic diagram illustrating an example reactive component network that may be used in the example oscillators of this disclosure.

FIG. 6 is a schematic diagram illustrating an example reactive component network 34 that may be used in the example oscillators of this disclosure. In some examples, reactive component network 34 may be used to implement the reactive component network 34 illustrated in FIG. 3. Reactive component network 34 includes inductors L1, L2, L3, L4 and nodes 36, 38, 120, 122, 124. Inductor L1 is coupled between node 36 and node 120. Inductor L2 is coupled between node 120 and node 122. Inductor L3 is coupled between node 122 and node 124. Inductor L4 is coupled between node 124 and node 38.

A tap 54 is coupled to node 120, and a tap 40 is coupled to a node 124. Nodes 36, 38 may form a first differential output, and taps 54, 40 may form a second differential output.

As shown in FIG. 6, taps 54, 40 are coupled to nodes 120, 124 between nodes 36, 38. As such, an inductance between node 36 and node 38 is greater than an inductance between tap 54 and tap 40 of reactive component network 34, thereby causing the voltage between tap 54 and tap 40 to be proportional to, but less than the voltage between node 36 and node 38.

Figure 7:
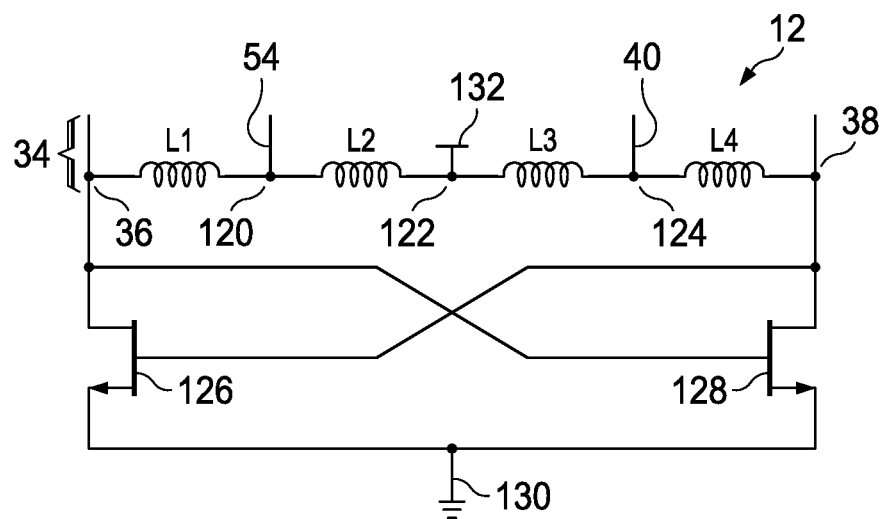
FIG. 7 is a schematic diagram illustrating an example oscillator that incorporates the example reactive component network of FIG. 6 according to this disclosure.

FIG. 7 is a schematic diagram illustrating an example oscillator 12 that incorporates the example reactive component network 34 of FIG. 6 according to this disclosure. Oscillator 12 includes transistors 126, 128, a ground rail 130, a high voltage rail 132, and the reactive component network 34 shown in FIG. 6. A source of transistor 126 is coupled to ground rail 130. A drain of transistor 126 is coupled to node 36 and to a gate of transistor 128. A gate of transistor 126 is coupled to node 38 and to a drain of transistor 128. A source of transistor 128 is coupled to ground rail 130. A drain of transistor 128 is coupled to node 38 and to a gate of transistor 126. A gate of transistor 128 is coupled to node 36 and to a drain of transistor 126. Node 122 of reactive component network 34 is coupled to high voltage rail 132.

Transistors 126, 128 may be examples of cross-coupled transistors where the outputs of the cross-coupled transistors are coupled to nodes 36, 38. Nodes 36, 38 form a first differential output for oscillator 12, and taps 40, 54 form a second differential output for oscillator 12. In FIG. 7, inductors L1, L2, L3, L4 are an example of a configuration of one or more inductors coupled in series between the node 36 and node 38 of oscillator 12.

During operation, transistors 126, 128 may each operate as a common source amplifier with a reactive load. Inductors L1, L2, L3, L4 may form all or part of the reactive loads for transistors 126, 128. Specifically, transistor 126 may amplify and apply a 180 degree phase shift to the signal at the drain of transistor 128, and transistor 128 may amplify and apply a 180 degree phase shift to the signal at the drain of transistor 126. The feedback loop formed by the cross-coupled oscillators may collectively cause the signals at the two differential outputs at nodes 36, 38 to oscillate. The inductances of inductors L1, L2, L3, L4 along with one or more parasitic capacitances in transistors 126, 128 may control the frequency of oscillation for oscillator 12.

The second differential output of oscillator 12 formed by taps 40, 54 may provide an oscillating output signal that is proportional to, but less than, the output signal provided by the first differential output of oscillator 12 formed by nodes 36, 38. The gain of a power amplifier may be able to be varied by selecting which of these voltages to amplify. By using one or more taps of a network of reactive components (e.g., inductors L1, L2, L3, L4) included in oscillator 12 to output different voltages voltage levels, the gain of a power amplifier may be able to be varied without requiring additional reactive components in the power amplifier or external to the an integrated circuit. In this way, a variable gain, relatively low-power amplifier may be obtained with a relatively small number of components.

Figure 8:
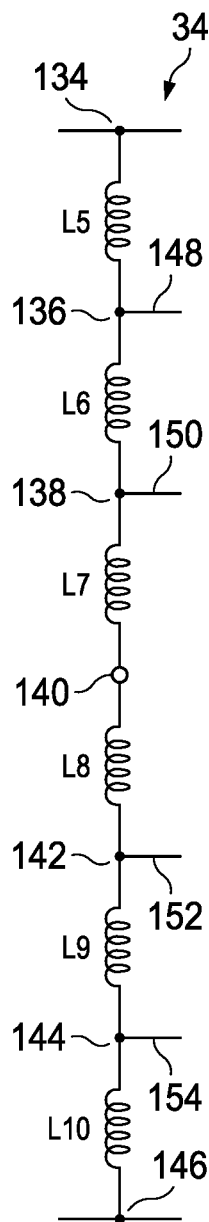
FIG. 8 is a schematic diagram illustrating another example reactive component network that may be used in the example oscillators of this disclosure.

FIG. 8 is a schematic diagram illustrating another example reactive component network 34 that may be used in the example oscillators of this disclosure. Reactive component network 34 includes inductors L5, L6, L7, L8, L9, L10, nodes 134, 136, 138, 140, 142, 144, 146, and taps 148, 150, 152, 154. Inductor L5 is coupled between node 134 and node 136. Inductor L6 is coupled between node 136 and node 138. Inductor L7 is coupled between node 138 and node 140. Inductor L8 is coupled between node 140 and node 142. Inductor L9 is coupled between node 142 and node 144. Inductor L10 is coupled between node 144 and node 146. In FIG. 8, inductors L5, L6, L7, L8, L9, L10 are an example of a configuration of one or more inductors coupled in series between node 134 and node 146 of oscillator 12.

Tap 148 is coupled to node 136. Tap 150 is coupled to node 138. Tap 152 is coupled to node 142. Tap 154 is coupled to node 144.

Nodes 134, 146 may form a first differential output, taps 136, 144 may form a second differential output, and taps 138, 142 may form a third differential output. The second differential output may output an oscillating signal that is proportional to, but less than, the signal output by the first and differential output. The third differential output may output an oscillating signal that is proportional to, but less than, the signals output by the first and second differential outputs. In general, any number of taps may be placed in a series of inductors connected in series to form any number of differential outputs, and thereby provide any number of gain steps for a power amplifier according to this disclosure.

Figure 9:
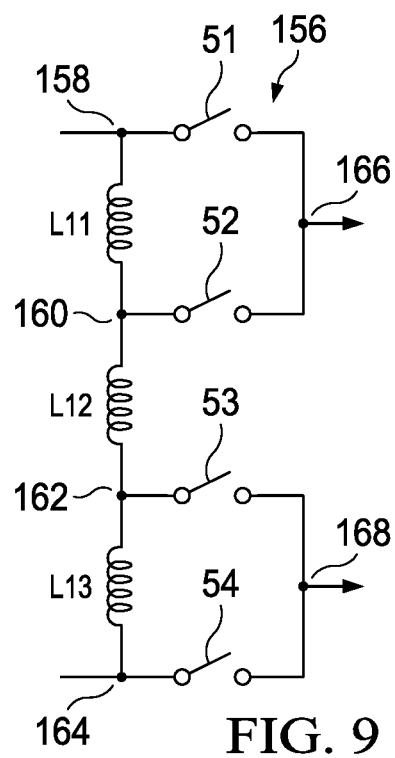
FIG. 9 is a schematic diagram of an example reactive component and switching circuit that may be used in the example transmitters of this disclosure.

FIG. 9 is a schematic diagram of an example reactive component and switching circuit 156 that may be used in the example transmitters of this disclosure. In some examples, reactive component network 34 may be used to implement reactive component network 34 shown in FIG. 3 and/or selection circuit 60 shown in FIG. 4. Reactive component and switching circuit 156 includes inductors L11, L12, L13, switches S1, S2, S3, S4, and nodes 158, 160, 162, 164, 166, 168.

Inductor L11 is coupled between node 158 and node 160. Inductor L12 is coupled between node 160 and node 162.

Inductor L13 is coupled between node 162 and node 164. Switch S1 is coupled between node 158 and node 166. Switch S2 is coupled between node 160 and node 166. Switch S3 is coupled between node 162 and node 168. Switch S4 is coupled between node 164 and node 168.

Nodes 158, 164 may form a differential input. Nodes 166, 168 may form a differential output.

In some examples, inductors L11, L12, L13 and nodes 158, 160, 162, 164 may be included in a reactive component network 34 of oscillator 12 (e.g., FIG. 3), and switches S1, S2, S3, S4 may be included in a selection circuit 60 of power amplifier 14 (e.g., FIG. 4). In such examples, nodes 158, 164 may correspond, respectively, to nodes 36, 38, and nodes 166, 168 may correspond to the output of selection circuit 60. In such examples, control inputs of switches S1, S2, S3, S4 may be coupled to gain control A lead 78.

During operation a control circuit may selectively open and close switches S1, S2, S3, S4 based on a gain control signal. During a first operational state, switches S1, S4 may be closed and switches S2, S3 may be open, thereby causing the voltage between nodes 158, 164 to be output at nodes 166, 168. During a second operational state, switches S2, S3 may be closed and switches S1, S4 may be open, thereby causing the voltage between node 160 and node 162 to be output at nodes 166, 168.

In some examples, inductors L11, L12, L13 may form a tapped inductor. The tapped inductor along with switches S1, S2, S3, S4 may provide a gain step between a VCO and a PA. In some examples, inductors L11, L12, L13 may be implemented with an inductor inside of a VCO core, and switches S1, S2, S3, S4 may provide the attenuator steps.

Figure 10:
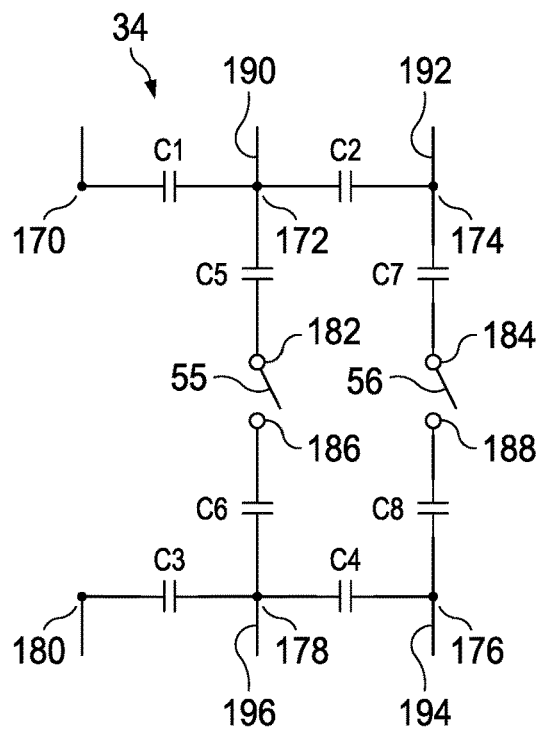
FIG. 10 is a schematic diagram illustrating another example reactive component network that may be used in the example oscillators of this disclosure.

FIG. 10 is a schematic diagram illustrating another example reactive component network 34 that may be used in the example oscillators of this disclosure. Reactive component network 34 includes capacitors C1, C2, C3, C4, C5, C6, C7, C8, switches S5, S6, nodes 170, 172, 174, 176, 178, 180, 182, 184, 186, 188 and taps 190, 192, 194, 196. Capacitor C1 is coupled between node 170 and node 172. Capacitor C2 is coupled between node 172 and node 174. Capacitor C3 is coupled between node 178 and node 180. Capacitor C4 is coupled between node 176 and node 178. Capacitor C5 is coupled between node 172 and node 182. Capacitor C6 is coupled between node 178 and node 186. Capacitor C7 is coupled between node 174 and node 184. Capacitor C8 is coupled between node 176 and node 188. Switch S5 is coupled between node 182 and node 186. Switch S6 is coupled between node 184 and node 188. Tap 190 is coupled to node 172, tap 192 is coupled to node 174, tap 194 is coupled to node 176, and tap 196 is coupled to node 178.

Node 170 and node 180 may form the ends of reactive component network 34 and may correspond to a first differential output of reactive component network 34. Taps 190, 196 may form a second differential output of reactive component network 34, and taps 192, 194 may form a third differential output of reactive component network 34.

As shown in FIG. 10, taps 192, 194 are coupled to reactive component network 34 between taps 190, 196 and between nodes 170, 180. Similarly, taps 190, 196 are coupled to reactive component network 34 between nodes 170, 180. As such, a capacitance between nodes 170, 180 is greater than a capacitance between taps 190, 196 (when one of switches S5, S6 is closed), thereby causing the voltage between taps 190, 196 to be proportional to, but less than, the voltage between nodes 170, 180. Similarly, a capacitance between nodes 170, 180 is greater than a capacitance between taps 190, 196 (when switch S6 is closed), which is greater than a capacitance between taps 192, 194 (when switch S6 is closed), thereby causing the voltage between taps 192, 194 to be proportional to, but less than, the voltage between taps 190, 196 and the voltage between nodes 170, 180.

Figure 11:
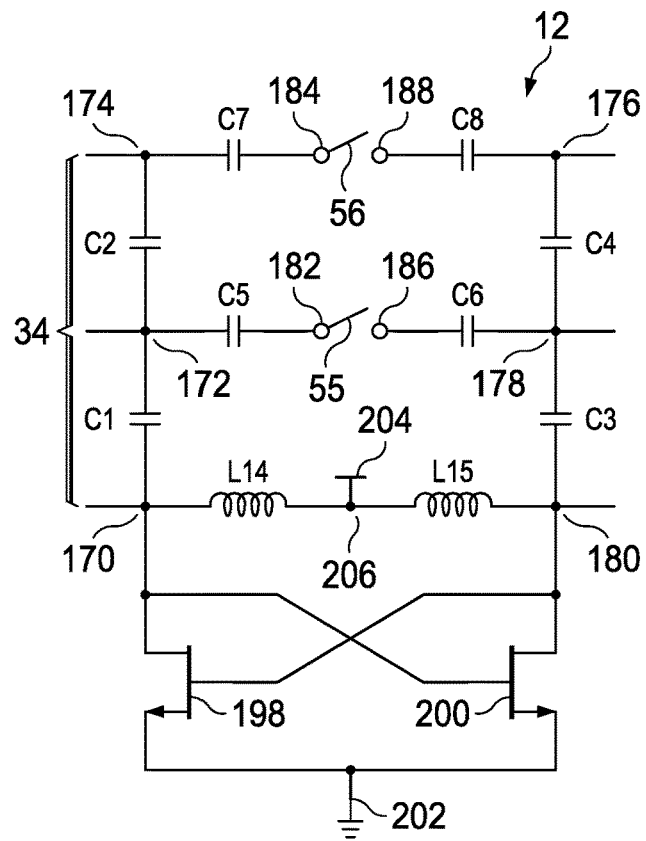
FIG. 11 is a schematic diagram illustrating an example oscillator that incorporates the example reactive component network of FIG. 10 according to this disclosure.

FIG. 11 is a schematic diagram illustrating an example oscillator 12 that incorporates the example reactive component network 34 of FIG. 10 according to this disclosure. Oscillator 12 includes transistors 198, 200, inductors L14, L15, a ground rail 202, a high voltage rail 204, a node 206 and the reactive component network 34 shown in FIG. 10. A source of transistor 198 is coupled to ground rail 202. A drain of transistor 198 is coupled to node 170 and to a gate of transistor 200. A gate of transistor 198 is coupled to node 180 and to a drain of transistor 200. A source of transistor 200 is coupled to ground rail 202. A drain of transistor 200 is coupled to node 180 and to a gate of transistor 198. A gate of transistor 200 is coupled to node 170 and to a drain of transistor 198. Inductor L14 is coupled between node 170 and node 206. Inductor L15 is coupled between node 206 and node 180. Node 206 is coupled to high voltage rail 204.

Transistors 198, 200 may be examples of cross-coupled transistors where the outputs of the cross-coupled transistors are coupled to nodes 36, 38. Switches S5, S6 may include control inputs that are coupled to a control circuit. In FIG. 11, when one of switches S5, S6 are closed, the capacitances between node 170 and node 180 may be an example of a configuration of one or more capacitors coupled in series between the node 170 and node 180 of oscillator 12.

During operation, transistors 198, 200 may each operate as a common source amplifier with a reactive load. Capacitors C1, C2, C3, C4, C5, C6, C7, C8 and inductors L14, L15 may form all or part of the reactive loads for transistors 198, 200. Specifically, transistor 198 may amplify and apply a 180 degree phase shift to the signal at the drain of transistor 200, and transistor 200 may amplify and apply a 180 degree phase shift to the signal at the drain of transistor 198. The feedback loop formed by the cross-coupled oscillators may collectively cause the signals at the two differential outputs at nodes 170, 180 to oscillate. The inductances of inductors L14, L15 along with the capacitances of one or more of capacitors C1, C2, C3, C4, C5, C6, C7, C8 (and, in some examples, one or more parasitic capacitances in transistors 198, 200) may control the frequency of oscillation for oscillator 12.

Switches S5, S6 may be selectively opened and closed to program the oscillation frequency of oscillator 12. Any combination of open and closed states for switches S5, S6 may correspond to a different oscillation frequency.

The third differential output of oscillator 12 formed by taps 192, 194 may provide an oscillating output signal that is proportional to, but less than, the output signal provided by the second differential output of oscillator 12 formed by taps 190, 196, which may be proportional to, but less than, the output signal provided by the first differential output of oscillator 12 formed by nodes 170, 180. The gain of a power amplifier may be able to be varied by selecting which of the voltages to amplify. By using one or more taps of a network of reactive components (e.g., capacitors C1, C2, C3, C4, C5, C6, C7, C8) included in oscillator 12 to output different voltages voltage levels, the gain of a power amplifier may be able to be varied without requiring additional reactive components in the power amplifier or external to the an integrated circuit. In this way, a variable gain, relatively low-power amplifier may be obtained with a relatively small number of components.

Figure 12:
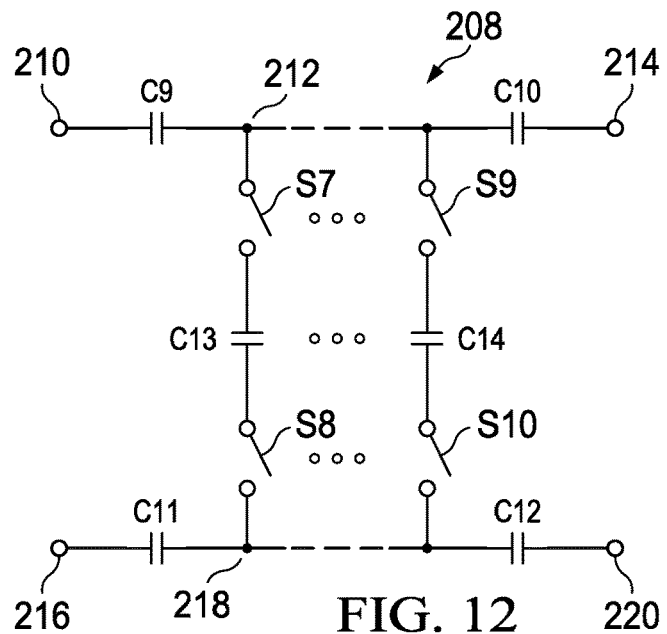
FIG. 12 is a schematic diagram illustrating another example reactive component network that may be used in the example oscillators of this disclosure.

FIG. 12 is a schematic diagram illustrating another example reactive component network 208 that may be used in the example oscillators of this disclosure. Reactive component network 208 includes capacitors C9, C10, C11, C12, C13, C14, switches S7, S8, S9, S10, and nodes 210, 212, 214, 216, 218, 220. Capacitor C9 is coupled between node 210 and node 212. Capacitor C10 is coupled between node 212 and node 214. Capacitor C11 is coupled between node 216 and node 218. Capacitor C12 is coupled between node 218 and node 220. Capacitor C13 is coupled between switch S7 and switch S8. Capacitor C14 is coupled between switch S9 and switch S10. Switch S7 is coupled between capacitor C13 and node 212. Switch S8 is coupled between capacitor C13 and node 218. Switch S9 is coupled between capacitor C14 and node 212. Switch S10 is coupled between capacitor C14 and node 218.

In some examples, reactive component network 208 in FIG. 12 may implement a capacitive attenuator circuit that may be used in a coarse gain control circuit of this disclosure. The capacitive attenuator circuit may provide a gain step between a VCO and a power amplifier in a transmitter. In some examples, reactive component network 208 may be combined with the capacitors inside of a VCO core, and switches S7, S8, S9, S10 may provide the attenuator steps.

Figure 13:
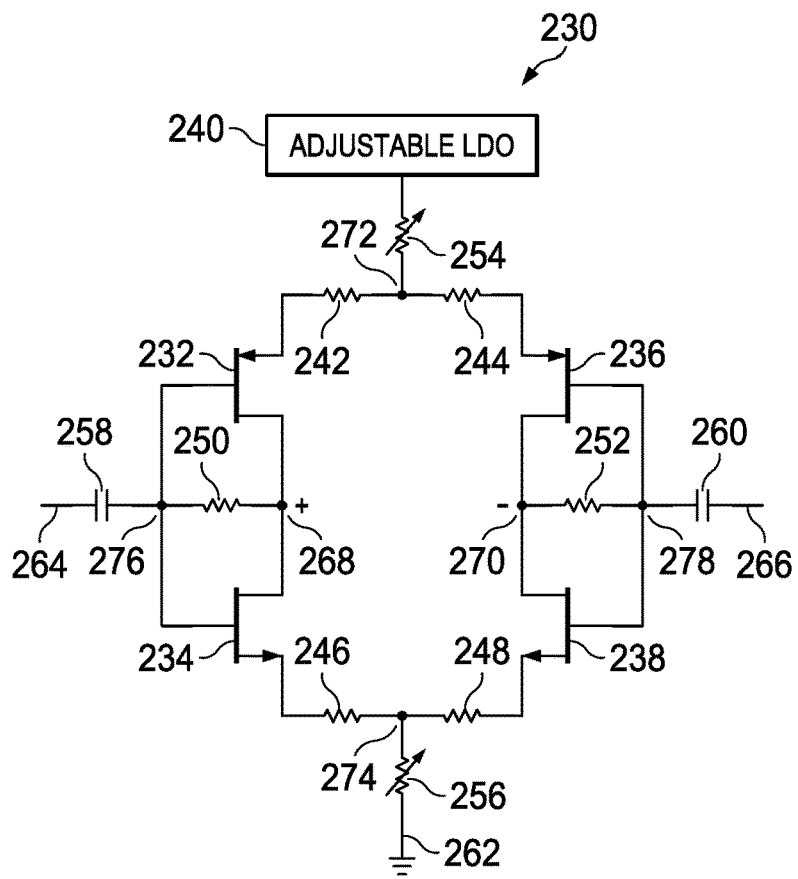
FIGS. 13-15 are schematic diagrams illustrating example amplifier stages that may be used in the power amplifiers of this disclosure.

FIG. 13 is a schematic diagram illustrating an example amplifier stage 230 that may be used in the power amplifiers of this disclosure. Amplifier stage 230 includes transistors 232, 234, 236, 238, an adjustable LDO 240, resistors 242, 244, 246, 248, bias resistors 250, 252, adjustable resistances 254, 256, capacitors 258, 260, a ground rail 262, and nodes 264, 266, 268, 270, 272, 274, 276, 278.

Transistor 232 is coupled between resistor 242 and node 268. Specifically, a source of transistor 232 is coupled to resistor 242, and a drain of transistor 232 is coupled to node 268. A gate of transistor 232 is coupled to node 276. Transistor 234 is coupled between resistor 246 and node 268. Specifically, a source of transistor 234 is coupled to resistor 246, and a drain of transistor 234 is coupled to node 268. A gate of transistor 234 is coupled to node 276.

Transistor 236 is coupled between resistor 244 and node 270. Specifically, a source of transistor 236 is coupled to resistor 244, and a drain of transistor 236 is coupled to node 270. A gate of transistor 236 is coupled to node 278. Transistor 238 is coupled between resistor 248 and node 270. Specifically, a source of transistor 238 is coupled to resistor 248, and a drain of transistor 238 is coupled to node 270. A gate of transistor 238 is coupled to node 278.

Resistor 242 is coupled between transistor 232 and node 272. Resistor 244 is coupled between transistor 236 and node 272. Resistor 246 is coupled between transistor 234 and node 274. Resistor 248 is coupled between transistor 238 and node 274. Bias resistor 250 is coupled between node 268 and node 276. Bias resistor 252 is coupled between node 270 and node 278.

Adjustable resistance 254 is coupled between an output of adjustable LDO 240 and node 272. Adjustable resistance 256 is coupled between node 274 and ground rail 262. Capacitor 258 is coupled between node 264 and node 276. Capacitor 260 is coupled between node 266 and node 278.

Transistors 232, 234 and bias resistor 250 form a first self-biased amplifier (e.g., self-biased inverter). Transistors 236, 238 and bias resistor 252 form a second self-biased amplifier (e.g., self-biased inverter). Together transistors 232, 234, 236, 238 and bias resistors 250, 252 form a differential self-biased amplifier (e.g., differential self-biased inverter).

Nodes 264, 266 may form a differential input for amplifier stage 230, and nodes 268, 270 may form a differential output for amplifier stage 230. Specifically, node 264 may form a non-inverting input, and node 266 may form an inverting input. Similarly, node 268 may form a non-inverting output, and node 270 may form an inverting output.

As shown in FIG. 13, amplifier stage 230 includes: (1) a power rail (e.g., the lead coupled to the output of adjustable LDO 240), an adjustable resistance 254, (2) a first self-biased inverter (e.g., transistors 232, 234 and resistor 250) coupled to the power rail via adjustable resistance 254, and (3) a second self-biased inverter (e.g., transistors 236, 238 and resistor 252) coupled to the power rail (e.g., the output of adjustable LDO 240) via adjustable resistance 254. The power rail is coupled to an adjustable power source, of which adjustable LDO 240 is an example. Amplifier stage 230 further includes an adjustable resistance 256. The first self-biased inverter (e.g., transistors 232, 234 and resistor 250) is coupled to ground rail 262 via adjustable resistance 256, and the second self-biased inverter (e.g., transistors 236, 238 and resistor 252) is coupled to ground rail 262 via adjustable resistance 256.

The first self-biased inverter includes an input (e.g., node 276), an output (e.g., node 268), and a bias resistor 250 coupled between the input and the output of the first self-biased inverter. The second self-biased inverter includes an input (e.g., node 278), an output (e.g., node 270), and a bias resistor 252 coupled between the input and the output of the second self-biased inverter.

During operation, bias resistors 250, 252 bias the self-biased inverters at a voltage that is approximately half-way between the voltage output by adjustable LDO 240 and ground. Capacitors 258, 260 filter out direct current (DC) and other low frequency signal components received at nodes 264, 266. The amplifiers formed by transistors 232, 234, 236, 238 amplify the filtered input signal received from capacitors 258, 260, and output the amplified signal at nodes 268, 270.

In some examples, amplifier stage 230 may implement a self-biased class AB PA stage. Adjustable resistances 254, 256 may control the current consumption of the PA stage and provide rejection of the second harmonic tone from the VCO, while resistors 242, 244, 246, 248 may provide the linearity for the stage such that substantially no additional harmonics are generated.

In some examples, a coarse gain control may be coupled to the adjustable resistances 254, 256 and a fine gain control may be coupled to adjustable LDO 240. In additional examples, adjustable LDO 240 may be fixed power supply that is not variable.

Increasing the resistances of adjustable resistances 254, 256 may increase the even-order harmonic suppression of amplifier stage 230, but decrease the gain of amplifier stage 230. Decreasing the resistances of adjustable resistances 254, 256 may have the opposite effect. As such, by positioning adjustable resistances 254, 256 at the locations illustrated in FIG. 13, the tradeoff between even-order harmonic suppression and amplifier gain may be dynamically adjusted and balanced in amplifier stage 230.

Figure 14:
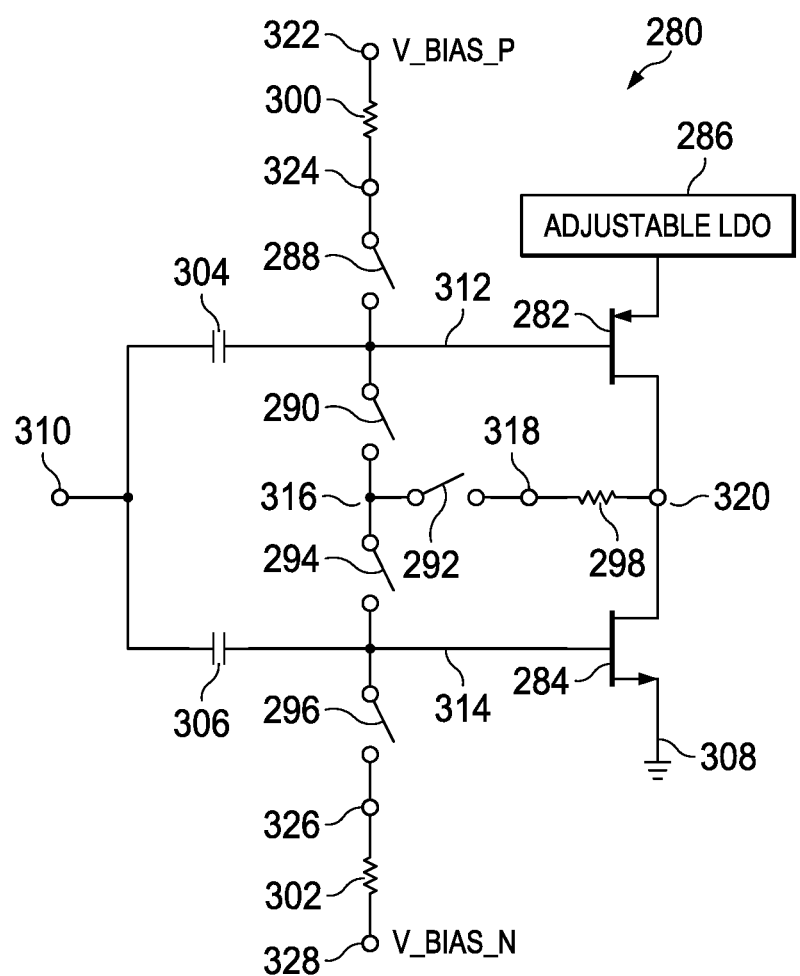

FIG. 14 is a schematic diagram illustrating another example amplifier stage 280 that may be used in the power amplifiers of this disclosure. Amplifier stage 280 includes transistors 282, 284, an adjustable LDO 286, switches 288, 290, 292, 294, 296, bias resistors 298, 300, 302, capacitors 304, 306, a ground rail 308, and nodes 310, 312, 314, 316, 318, 320, 322, 324, 326, 328.

Transistor 282 is coupled between adjustable LDO 286 and node 320. Specifically, a source of transistor 282 is coupled to an output of adjustable LDO 286, and a drain of transistor 282 is coupled to node 320. A gate of transistor 282 is coupled to node 312. Transistor 284 is coupled between node 320 and ground rail 308. Specifically, a source of transistor 284 is coupled to ground rail 308, and a drain of transistor 284 is coupled to node 320. A gate of transistor 284 is coupled to node 314.

Switch 288 is coupled between node 312 and node 324. Switch 290 is coupled between node 312 and node 316. Switch 292 is coupled between node 316 and node 318. Switch 294 is coupled between node 316 and node 314. Switch 296 is coupled between node 314 and node 326. Bias resistor 298 is coupled between node 318 and node 320. Bias resistor 300 is coupled between node 322 and node 324. Bias resistor 302 is coupled between node 326 and node 328. Capacitor 304 is coupled between node 310 and node 312. Capacitor 306 is coupled between node 310 and node 314. Node 322 is coupled to a first bias voltage source (V_BIAS_P), and node 328 is coupled to a second bias voltage source (V_BIAS_N).

When switches 290, 292, 294 are closed, transistors 282, 284 and bias resistor 298 form a self-biased amplifier (e.g., self-biased inverter). Node 310 may form an input for amplifier stage 280, and node 320 may form an output for amplifier stage 280.

As shown in FIG. 14, amplifier stage 280 includes: (1) an inverter having a transistor 282 and a transistor 284, (2) a bias resistor 298 coupled to the output (e.g., node 320) of the inverter, (3) a first bias voltage source (V_BIAS_P), (4) a second bias voltage source (V_BIAS_N), (5) a switch 290 coupled between bias resistor 298 and a gate of transistor 282, (6) a switch 288 coupled between the first bias voltage source (V_BIAS_P) and the gate of transistor 282, (7) a switch 294 coupled between bias resistor 298 and a gate of transistor 284, and (8) a switch 296 coupled between the second bias voltage source (V_BIAS_N) and the gate of transistor 284. Amplifier stage 280 may include a control unit (not shown) coupled to the switches 288, 290, 292, 294, 296 and configured to switch amplifier stage 280 between a self-biased operating mode and a non-linear operating mode.

During the self-biased operating mode, switches 290, 292, 294 are closed and switches 288, 296 are open. Bias resistor 298 biases the inverter formed by transistors 282, 284 at a voltage that is approximately half-way between the voltage output by adjustable LDO 286 and ground. Capacitors 304, 306 filter out direct current (DC) and other low frequency signal components received at node 310. The amplifier formed by transistors 282, 284 amplifies the filtered input signal received at nodes 312, 314, and outputs the amplified signal at node 320.

During a non-linear operating mode, switches 290, 292, 294 are open and switches 288, 296 are closed. A first bias voltage source (V_BIAS_P) biases transistor 282 via bias resistor 300. A second bias voltage source (V_BIAS_N) biases transistor 284 via bias resistor 302. Capacitors 304, 306 filter out direct current (DC) and other low frequency signal components received at node 310. The amplifier formed by transistors 282, 284 amplifies the filtered input signal received at nodes 312, 314, and outputs the amplified signal at node 320.

As discussed above, amplifier stage 280 may operate in a self-biased mode or a non-linear mode depending on the configuration of switches 288, 290, 292, 294, 296. The self-biased mode may provide a greater degree of linearity than the non-linear mode, but may be less power efficient. On the other hand, the non-linear mode may be more power efficient, but provide less linearity. By providing an amplifier stage that may be configurable to operate in a self-biased mode and a non-linear mode, the tradeoff between linearity and power efficiency may be dynamically adjusted and balanced in the amplifier.

Figure 15:
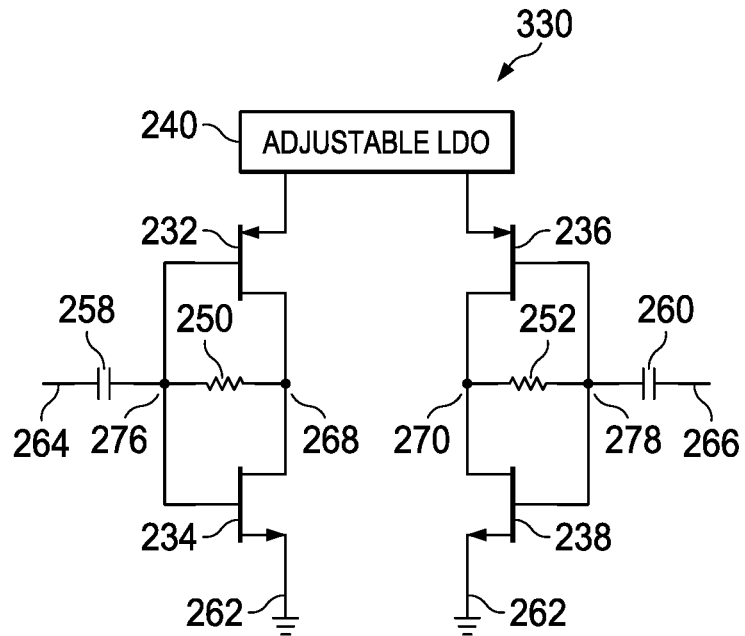

FIG. 15 is a schematic diagram illustrating another example amplifier stage 330 that may be used in the power amplifiers of this disclosure. Amplifier stage 330 is similar to the amplifier stage 230 illustrated in FIG. 13 except that: (1) resistors 242, 244, 246, 248 and adjustable resistances 254, 256 are omitted; and (2) transistors 232, 234 and transistors 236, 238 are separately coupled to adjustable LDO 240. Same or similar components between FIGS. 13 and 15 have been numbered with identical reference numerals. As shown in FIG. 15, a source of transistor 232 is coupled directly to a first output of adjustable LDO 240 without any intervening resistance, and a source of transistor 236 is coupled directly to a second output of adjustable LDO 240 without any intervening resistance.

Figure 16:
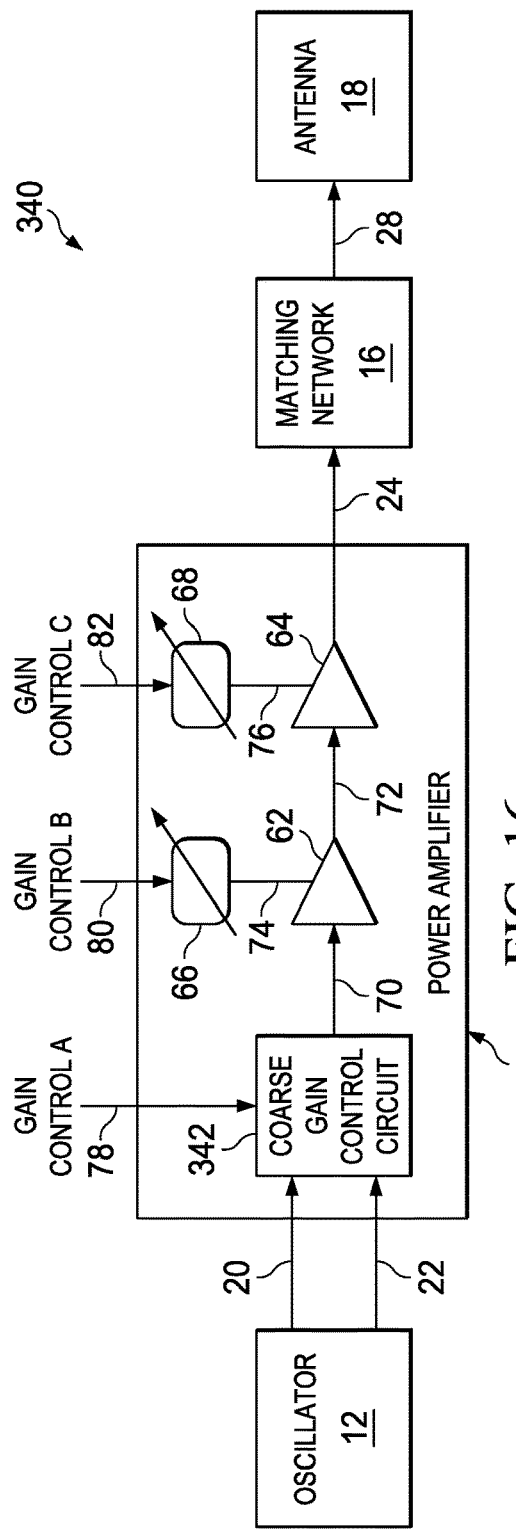

FIG. 16 is a block diagram illustrating another example transmitter 340 according to this disclosure. Transmitter 340 is similar to transmitter 10 shown in FIG. 4 except that transmitter 340 in FIG. 16 includes a coarse gain control circuit 342 instead of a selection circuit 60. Same or similar components between FIGS. 4 and 16 have been numbered with identical reference numerals.

A first input of coarse gain control circuit 342 is coupled to the first output of oscillator 12 via connection 20. A second input of coarse gain control circuit 342 is coupled to the second output of oscillator 12 via connection 22. An output of coarse gain control circuit 342 is coupled to an input of amplifier stage 62 via connection 70. A control input of coarse gain control circuit 342 is coupled to gain control A lead 78.

Coarse gain control circuit 342 may include one or more passive attenuator circuits (e.g., reactive components) that are configured to attenuate the signals received via connections 20, 22. The passive attenuator circuits may include capacitive attenuator circuits and/or inductive attenuator circuits. The passive attenuator circuits may be variable gain passive attenuator circuits (e.g., a network of reactive components with multiple taps) where the gain or level of attenuation of the circuit may be varied (e.g., selecting different combination of taps to produce the output signal). Example capacitive attenuator circuits are illustrated in FIGS. 10 and 12. Example inductive attenuator circuits are illustrated in FIGS. 6, 8, and 9.

Coarse gain control circuit 342 may select one of the signals received via connections 20, 22 and attenuate the signal with one or more passive attenuator circuits to generate an attenuated signal at connection 70. Coarse gain control circuit 342 may determine which of the signals to select based on the gain control A signal. In cases where the passive attenuator circuits are variable gain passive attenuator circuits, coarse gain control circuit 342 may determine by how much the passive attenuator circuit should attenuate the signal based on the gain control A signal. In some examples, the gain control A signal may include a first component that determines the signal to select, and a second component that determines the amount by which the passive attenuator is to attenuate the signal.

Figure 17:
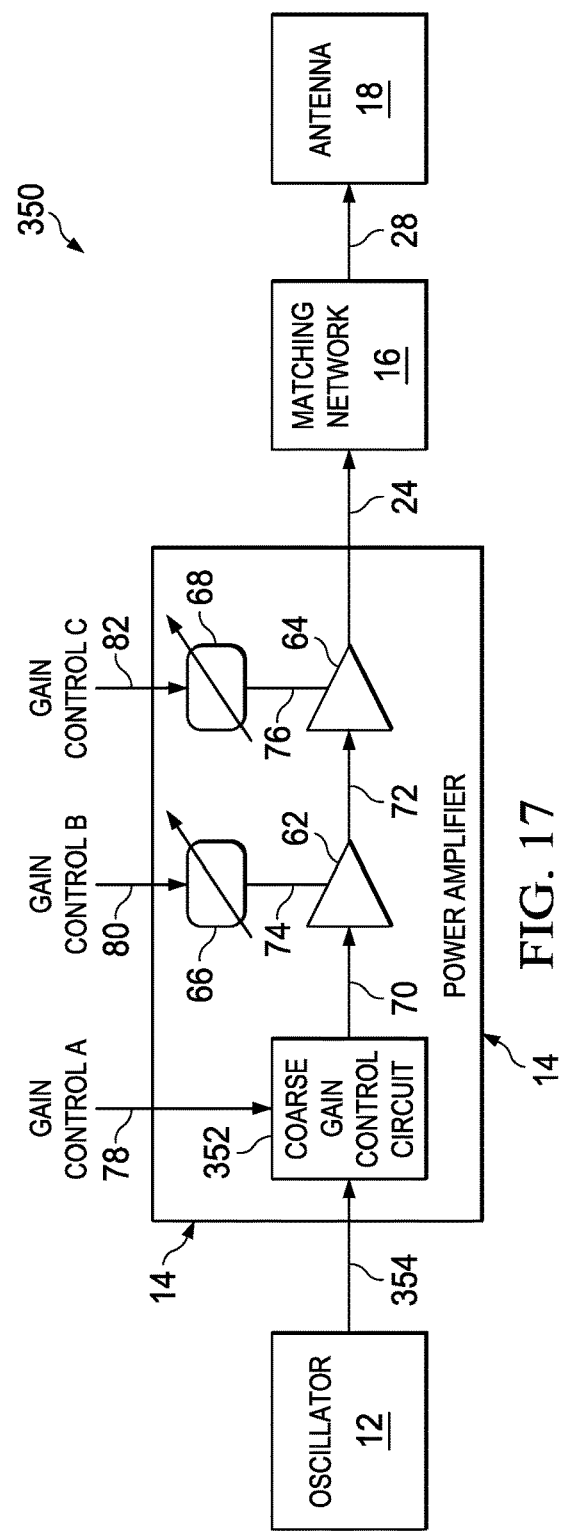

FIG. 17 is a block diagram illustrating another example transmitter 350 according to this disclosure. Transmitter 350 may be similar to transmitter 340 shown in FIG. 16 except that: (1) transmitter 350 in FIG. 17 includes a single-input coarse gain control circuit 352 instead of a dual-input coarse gain control circuit 342 as shown in FIG. 16; and (2) oscillator 12 is a single-output oscillator 12. Same or similar components between FIGS. 16 and 17 have been numbered with identical reference numerals.

An input of coarse gain control circuit 352 is coupled to an output of oscillator 12 via connection 354. An output of coarse gain control circuit 352 is coupled to an input of amplifier stage 62 via connection 70. A control input of coarse gain control circuit 352 is coupled to gain control A lead 78.

Coarse gain control circuit 352 may include one or more passive attenuator circuits (e.g., reactive components) that are configured to attenuate the signal received via connection 354. The passive attenuator circuits may include any of the passive attenuator circuits described above with respect to coarse gain control circuit 342 in FIG. 16.

Coarse gain control circuit 352 may attenuate the signal received via connection 354 with one or more passive attenuator circuits to generate an attenuated signal at connection 70. In cases where the passive attenuator circuits are variable gain passive attenuator circuits, coarse gain control circuit 352 may determine by how much the passive attenuator circuit should attenuate the signal based on the gain control A signal.

FIG. 17 illustrates an overall transmitter architecture. Coarse gain control circuit 352 may be a tapped inductor, a capacitive attenuator, or a bypass. The elements of coarse gain control circuit 352 may, in some examples, not provide any degradation of VCO phase noise. Amplifier stages 62, 64 may, in some examples, use self-biased amplifiers to engage substantially all of the current consumption towards signal processing and amplification. A control circuit may program the output signal swings of amplifier stages 62, 64 by changing the power supply from the LDO (e.g., adjustable power supplied 66, 68). The control circuit may program each of amplifier stages 62, 64 stage by the corresponding LDO to cover a wide programming range for output power. Power saving may be obtained by programming the LDO at a relatively desirable operation point to improve power consumption. For example, coarse gain control circuit 352 may provide attenuation to the VCO signal, then the LDO settings may be made smaller in order to process a signal of significantly smaller amplitude. Each LDO may, in some examples, use a replica circuit to obtain the reference voltage for the PA structures. Similar principles may be applied to the other amplifier architectures of this disclosure.

In some examples, coarse gain control circuit 352 may be implemented at least in part by using: (a) capacitive attenuation from a VCO capacitor array, (b) a tapped inductor by using a symmetrical tapping point from the VCO inductor, or (c) a simple bypass.

Figure 18:
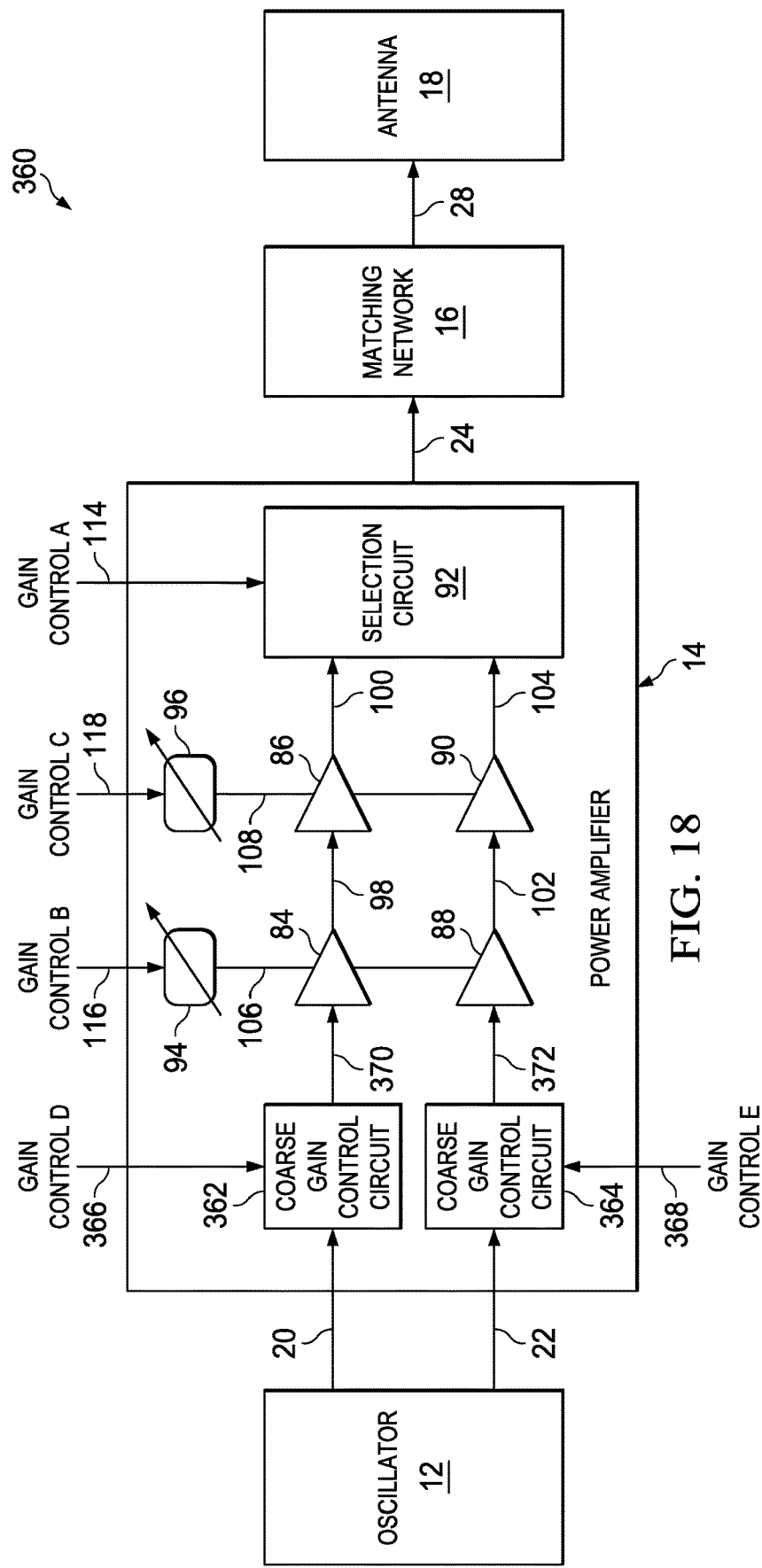

FIG. 18 is a block diagram illustrating another example transmitter 360 according to this disclosure. Transmitter 360 may be similar to transmitter 10 shown in FIG. 5 except that transmitter 360 in FIG. 18 further includes coarse gain control circuits 362, 364 and gain control leads 366, 368. Same or similar components between FIGS. 5 and 18 have been numbered with identical reference numerals.

An input of coarse gain control circuit 362 is coupled to the first output of oscillator 12 via connection 20. An input of coarse gain control circuit 364 is coupled to the second output of oscillator 12 via connection 22. An output of coarse gain control circuit 362 is coupled to an input of amplifier stage 84 via lead 370. An output of coarse gain control circuit 364 is coupled to an input of amplifier stage 88 via lead 372. A control input of coarse gain control circuit 362 is coupled to gain control lead D 366. A control input of coarse gain control circuit 364 is coupled to gain control lead E 368.

Coarse gain control circuits 362, 364 may include one or more passive attenuator circuits (e.g., reactive components) that are configured to attenuate the signals received via connections 20, 22. The passive attenuator circuits may include any of the passive attenuator circuits described above with respect to coarse gain control circuit 342 in FIG. 16.

Coarse gain control circuit 362 may attenuate the signal received via connection 20 with one or more passive attenuator circuits, and output the attenuated signal at lead 370. In cases where the passive attenuator circuits are variable gain passive attenuator circuits, coarse gain control circuit 362 may determine by how much the passive attenuator circuit should attenuate the signal based on a gain control signal received via gain control lead D 366.

Coarse gain control circuit 364 may attenuate the signal received via connection 22 with one or more passive attenuator circuits, and output the attenuated signal at lead 372. In cases where the passive attenuator circuits are variable gain passive attenuator circuits, coarse gain control circuit 364 may determine by how much the passive attenuator circuit should attenuate the signal based on a gain control signal received via gain control lead E 368.

Figure 19:
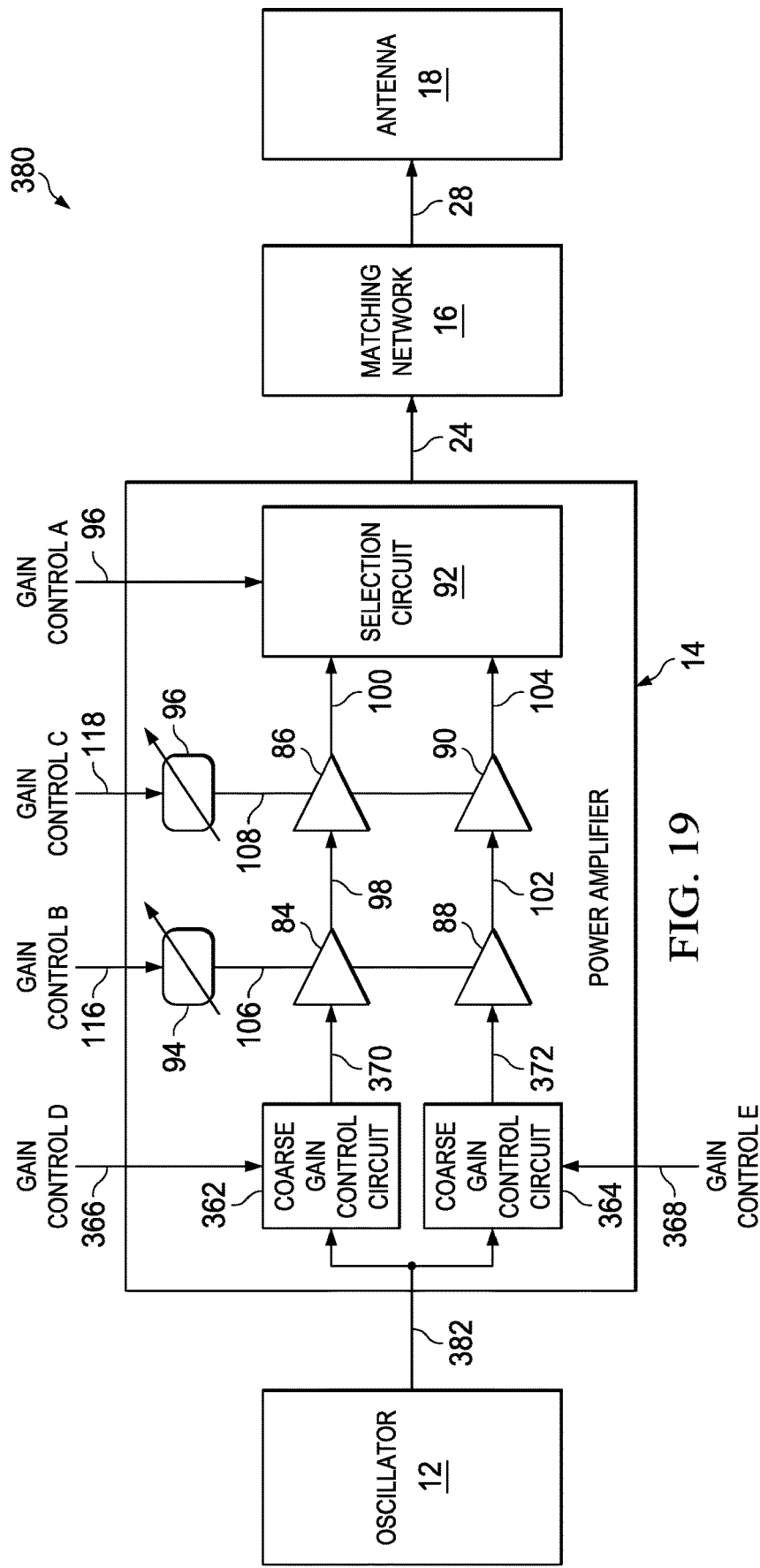

FIG. 19 is a block diagram illustrating another example transmitter 380 according to this disclosure. Transmitter 380 may be similar to transmitter 360 shown in FIG. 18 except that: (1) transmitter 380 in FIG. 19 includes a single-input power amplifier 14 instead of a dual-input power amplifier 14 as shown in FIG. 18, (2) oscillator 12 is a single-output oscillator 12, and (3) both inputs of coarse gain control circuits 362, 364 are coupled to the single output of oscillator 12 via connection 382. Same or similar components between FIGS. 18 and 19 have been numbered with identical reference numerals.

FIG. 20 is a block diagram illustrating another example transmitter 390 according to this disclosure. Transmitter 390 may be similar to transmitter 10 shown in FIG. 4 except that: (1) selection circuit 60 and gain control A lead 78 have been omitted from the power amplifier 14 in FIG. 20, and (2) an input of amplifier stage 62 is directly coupled to an output of oscillator 12 via connection 392. Same or similar components between FIGS. 4 and 20 have been numbered with identical reference numerals.

As shown, for example, in FIGS. 4 and 20, power amplifier 14 includes: (1) an amplifier stage 62 having an input and an output, and (2) an amplifier stage 64 having an input coupled to the output of amplifier stage 62, and (3) an output. Power amplifier 14 further includes: (1) a first adjustable power supply (e.g., adjustable power source 66) coupled to amplifier stage 62, and (2) a second adjustable power supply (e.g., adjustable power source 68) coupled to amplifier stage 64. In some examples, the first and second adjustable power supplies may be programmable LDOs and/or adjustable LDOs.

In some examples, an integrated circuit includes a voltage-controlled oscillator (VCO) (e.g., oscillator 12) having one or more reactive components (e.g., reactive component network 34). The integrated circuit further includes a programmable passive attenuation circuit (e.g., reactive component network 34, selection circuit 60, reactive component and switching circuit 156, coarse gain control circuit 342, coarse gain control circuit 352, coarse gain control circuits 362, 364) coupled to the VCO. The programmable passive attenuation circuit includes at least a portion of the one or more reactive components (e.g., reactive component network 34) included in the VCO. The integrated circuit further includes a power amplifier (e.g., power amplifier 14) coupled to the programmable passive attenuation circuit.

In some examples, the programmable passive attenuation circuit is an inductive attenuator. In such examples, the portion of the one or more reactive components may, in some examples, include one or more tapped inductors. In further examples, the programmable passive attenuation circuit forms a capacitive attenuator. In such examples, the one or more reactive components may, in some examples, include one or more capacitors In some examples, the power amplifier includes a first power source, a second power source, a first amplifier stage coupled to the first power source, and a second amplifier stage coupled to the second power source. In such examples, the first and second power sources may be programmable power sources, e.g., programmable LDOs.

Figure 21:
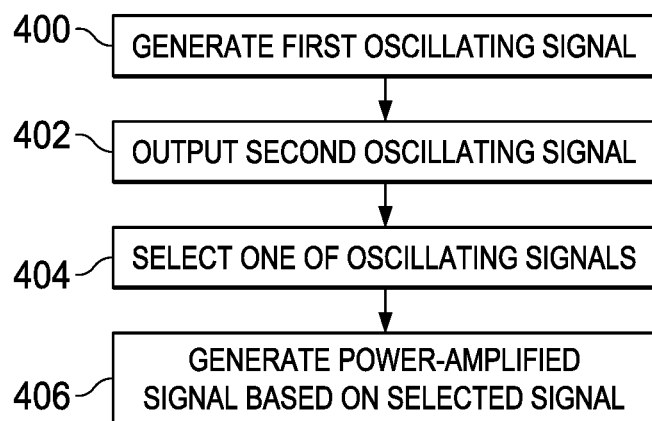
FIG. 21 is a flow diagram illustrating an example technique for amplifying the power of a signal according to this disclosure.

FIG. 21 is a flow diagram illustrating an example technique amplifying the power of a signal according to this disclosure. The techniques shown in FIG. 21 may be implemented in many of the circuits described in this disclosure. For purposes of this explanation, the technique will be described with respect to transmitter 10 illustrated in FIG. 3.

Oscillator 12 generates, with a reactive component network 34 included in oscillator 12, a first oscillating signal (400), and outputs the first oscillating signal via leads 42, 56. Oscillator 12 outputs, via one or more taps (e.g., taps 40, 54) included reactive component network 34, a second oscillating signal (402). The second oscillating signal has a magnitude that is proportional to and less than the first oscillating signal.

Power amplifier 14 selects one of the first and second oscillating signals to use for generating a power-amplified output signal based on a gain control (404). Power amplifier 14 generates the power-amplified output signal based on the selected one of the first and second oscillating signals (406).

In some examples (e.g., FIG. 4), power amplifier 14 may select one of the first and second oscillating signals to produce a selected oscillating signal, and amplify the selected oscillating signal to generate the power-amplified output signal. In such examples, power amplifier 14 may, in some examples, amplify the selected oscillating signal with a gain that is determined by an adjustable low-dropout regulator (LDO).

In further examples (e.g., FIG. 5), power amplifier 14 may amplify the first oscillating signal to generate a first power-amplified signal, amplify the second oscillating signal to generate a second power-amplified signal, select one of the first and second power-amplified signals to produce a selected power-amplified signal, and output the selected power-amplified signal as the power-amplified output signal. In such examples, power amplifier 14 may, in some examples, amplify the first oscillating signal with a gain that is determined by an adjustable low-dropout regulator (LDO), and amplify the second oscillating signal with the gain that is determined by the adjustable LDO.

This disclosure describes various power amplifier configurations that may be used to realize low-power power amplifier (PA) architectures for low-power radios. The techniques of this disclosure may provide architectures that realize low power, high efficiency power amplifiers with a reduced amount of external components to save external bill of materials. The low-power PAs described in this disclosure may, in some examples, have: (a) high efficiency, (b) low out-of-band harmonic contents, and (c) gain control. These characteristics may, in some examples, be realized with a relatively low amount of current consumption. The disclosure provides various self-biased transmit PA (TXPA) configurations. The PA architectures described in this disclosure may, in some examples, provide a relatively low area implementation scheme for gain control.

In some examples, the architecture of power amplifier 14 may be a multi-stage architecture. In some examples, the first stage (e.g., amplifier stage 62) of the multi-stage architecture may correspond to amplifier stage 230 illustrated in FIG. 13. In such examples, the architecture used for the second stage (e.g., amplifier stage 64), may use the same configuration in FIG. 13, but without resistors 242, 244, 246, 248 and adjustable resistances 254, 256 (i.e., with the resistance values of those resistors equal to 0). In this manner, the second amplifier stage may be configured to either be a single ended or a differential amplifier, depending on the nature of the external components (single ended and differential respectively).

To augment the efficiency further, the second amplifier stage may include a programmable gate bias in addition to an adjustable LDO to boost efficiency as illustrated in FIG. 14. The switches may be realized, in some examples, by using minimum size metal-oxide semiconductor (MOS) transistors. Amplifier stage 280 in FIG. 14 may be configured into two different modes: (a) a self-biased class AB architecture mode, and (b) a nonlinear type amplifier mode.

To configure amplifier stage 280 into the self-biased class AB architecture mode, a control circuit may close switches 290, 292, 294, and open switches 288, 296. In this case, self-biasing is enabled through bias resistor 298, and adjustable LDO 286 may be programmed to provide increased efficiency and linearity as desired.

To configure amplifier stage 280 into the self-biased class AB architecture mode, a control circuit may open switches 290, 292, 294, close switches 288, 296, and separately bias each transistor via separate bias voltage source (V_BIAS_P, V_BIAS_N). The output of amplifier stage 280 may be monitored using a built-in-self calibration to ensure that the DC level at the output is approximately in the middle of the voltage range.

Figure 22:
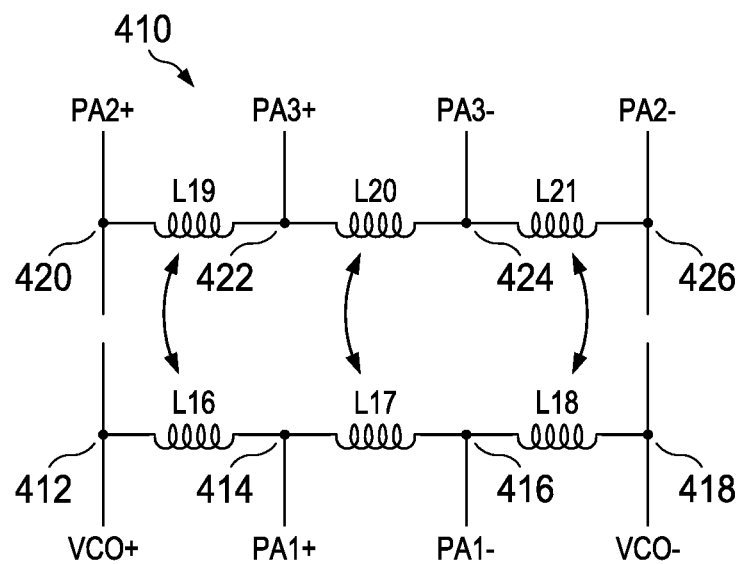
FIGS. 22 and 23 are schematic diagrams illustrating additional example reactive component networks that may be used in the example oscillators of this disclosure.

FIG. 22 is a schematic diagram illustrating an example reactive component network 410 that may be used in the example oscillators of this disclosure. Reactive component network 410 includes inductors L16, L17, L18, L19, L20, L21 and nodes 412, 414, 416, 418, 420, 422, 424, 426.

Inductor L16 is coupled between node 412 and node 414. Inductor L17 is coupled between node 414 and node 416. Inductor L18 is coupled between node 416 and node 418. Inductor L19 is coupled between node 420 and node 422. Inductor L20 is coupled between node 422 and node 424. Inductor L21 is coupled between node 424 and node 426. Taps may be coupled to one or more of nodes 412, 414, 416, 418, 420, 422, 424, 426.

Inductor L16 is magnetically coupled to inductor L19. Inductor L17 is magnetically coupled to inductor L20. Inductor L18 is magnetically coupled to inductor L21. In some examples, inductors L16, L19 may be a transformer, inductors L17, L20 may be a transformer, and/or inductors L18, L21 may be a transformer.

The taps coupled to nodes 412, 414 may form a first differential output (VCO+, VCO−). The taps coupled to nodes 414, 416 may form a second differential output (PA1+, PA1−). The taps coupled to nodes 420, 426 may form a third differential output (PA2+, PA2−). The taps coupled to nodes 422, 424 may form a fourth differential output (PA3+, PA3−). One or more of the differential outputs may be coupled to a corresponding input of a power amplifier.

In some examples, nodes 420, 426 may correspond, respectively, to nodes 36, 38 in FIGS. 2 and 3. In further examples, nodes 412, 414 may correspond, respectively, to nodes 36, 38 in FIGS. 2 and 3.

In some examples, reactive component network 410 may correspond to reactive component network 34 shown in FIGS. 2 and 3. In such examples, reactive component network 410 may include at least two chains of one or more reactive components, where each of the chains of reactive components includes one or more reactive components coupled in series (e.g., a first chain formed by inductors L16, L17, L18, and a second chain formed by inductors L19, L20, L21). The at least two chains of reactive components may be inductively coupled (or magnetically coupled) to each other. For example, one or more of the reactive components in the first chain of reactive components may be inductively coupled (or magnetically coupled) to one or more reactive components in the second chain of reactive components. One or more taps may be coupled to the first chain of reactive components and/or the second chain of reactive components to form one or more differential outputs.

In some examples, the first chain of reactive components may be electrically coupled to the active circuitry of an oscillator, and the second chain of reactive components may be inductively coupled to the first chain of reactive components. In some implementations of this example, a first differential output may be formed via taps coupled to the first chain of reactive components, and a second differential output may be formed via taps coupled to the second chain of reactive components. In further implementations of this example, at least two differential outputs may be formed via taps coupled to the first chain of reactive components. In additional implementations of the first example, at least two differential outputs may be formed via taps coupled to the second chain of reactive components.

In some examples, the inductances of inductor L16 and inductor L18 may be equal to each other, and the inductances of inductors L19, L20, L21 may be equal to each other. In additional examples, the inductance of inductor L17 may be equal to a first inductance value, the inductance of each of inductors L16, L18 may be equal to a second inductance value, and the inductance of each of inductors L19, L20, L21 may be equal to a third inductance value.

A reactive component network may be formed using one or both of a tapped inductor (with direct electrical coupling) and magnetic coupling (DC isolation). The reactive component network may use tapping from one or more coils (inductors) to generate different outputs with different levels of attenuation. The magnetic coupling may implement a fixed (coarse) step attenuator.

In some examples, the coarse step attenuation in the reactive components of this disclosure may be process invariant due to the fact that the amount of attenuation may correspond to a ratio between two similar quantities that are also process invariant. In further examples, the coarse step attenuation may provide frequency independent signal scaling. For example, if a VCO oscillates at 2.4 GHz vs 3.0 GHz, the coarse gain control techniques of this disclosure may, in such examples, provide the same signal attenuation.

Figure 23:
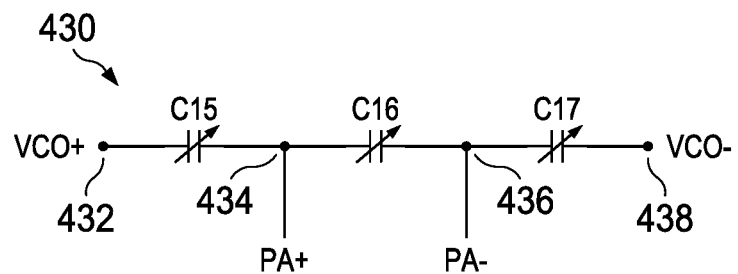

FIG. 23 is a schematic diagram illustrating an example reactive component network 430 that may be used in the example oscillators of this disclosure. Reactive component network 430 includes capacitors C15, C16, C17 and nodes 432, 434, 436, 438.

Capacitor C15 is coupled between node 432 and node 434. Capacitor C16 is coupled between node 434 and node 436. Capacitor C17 is coupled between node 436 and node 438. Taps may be coupled to one or more of nodes 432, 434, 436, 438.

The taps coupled to nodes 432, 438 may form a first differential output (VCO+, VCO−). The taps coupled to nodes 434, 436 may form a second differential output (PA+, PA−). FIG. 23 illustrates a configuration where tapping may be exercised using multiple capacitors connected in series, and the signals may be symmetrically taken out of the reactive component network to interface with a power amplifier.

Each of capacitors C15, C16, C17 in the example configuration of FIG. 23 is a variable capacitance. In other examples, all of capacitors C15, C16, C17 may be fixed capacitances, or some of capacitors C15, C16, C17 may be variable capacitances and some of capacitors C15, C16, C17 may be fixed capacitances. In some examples, the variable capacitances may be voltage controlled. In some examples, the capacitances of capacitors C15, C17 may be equal to each other, and the capacitance of capacitor C16 may be different from the capacitances of capacitors C15, C17.

In examples where capacitors C15, C16, C17 are fixed capacitances, reactive component network 430 may provide a constant attenuation factor. In some implementations where capacitors C15, C16, C17 are voltage-controlled variable capacitances, all of capacitors C15, C16, C17 may be programmed by the same control voltage, in which case, constant attenuation may be achieved and the center frequency of the VCO may be changed by the same set of capacitors. In additional implementations where capacitors C15, C16, C17 are voltage-controlled variable capacitances, capacitors C15, C16, C17 may be programmed with respect to different voltages. For example, the capacitances (C0) of capacitors C15, C17 may be programmed by a first voltage (V0), and the capacitance (C1) of capacitor C16 may be programmed by a second voltage (V1). In such an implementation, both C0 and C1 may take part in frequency control, and by making V0 change in a different manner than V1, a variable attenuator step (fine control in addition to a coarse gain control) may be achieved.

Ultra low power transceivers may use a low power PA with multiple gain steps for reduction of overall system power. It may be desirable to implement such receivers with a minimum number of external components.

This disclosure describes various techniques to achieve, in some examples, low-power PAs. According to a first technique, a class AB style two-stage PA architecture may be used for power amplification, where each stage may be independently programmed through separate LDOs. According to a second technique a coarse gain step may be obtained using a capacitive attenuator and a fine gain step may be provided through LDOs. This technique may simplify the design of the gain steps. According to a third technique, a coarse gain step is obtained using a tapped inductor (e.g., auto transformer). The tapped inductor may, in some cases, consume zero additional power and area. A fine gain step may be performed using LDOs In some cases, the LDOs may not have to cover the entire range for gains steps because of the coarse gain step provided by the tapped inductors and/or capacitive attenuators. This may reduce the power consumption and area of the resulting amplifier. In some examples, on-chip calibration techniques for frequency drift may be used to compensate for finite isolation offered by the two-stage PA to the VCO.

In some examples, coarse gain control and fine gain control may be provided by programmable LDOs. In further examples, coarse gain control may be provided using a capacitive attenuator, and fine gain control may be provided using an LDO. In additional examples, coarse gain control may be provided using an auto-transformer, and fine gain control may be provided using an LDO.

The techniques of this disclosure, in some examples, may use a class AB PA architecture. This may allow operation, in some examples, with only one radio frequency (RF) pin, and with low externals. In some examples, no degeneration is used, leading to a reduced current consumption and better power efficiency. In further examples, various stages are self-biased, with a relatively simple design, and the gain may be fully controlled by an LDO. In additional examples, the gain step realized by one or more of the following: (1) fully by LDO control (both coarse and fine), (2) partially by capacitive attenuator (coarse steps using capacitive attenuator, fine step using LDOs), and (3) partially by inductor tapping (coarse steps using autotransformer, fine step using LDOs In some examples, the amplifier stages may be self-biased, which may allow biasing to occur with no additional overhead in terms of bias current. In further examples, the gain step may be implemented using: (1) an LDO only, (2) an LDO and capacitive attenuator, (3) an LDO and tapped inductor. In additional examples, the techniques of this disclosure may use two stages that use independent LDOs, which may allow the architecture to be reconfigured with respect to efficiency and harmonic performance. In further examples, the techniques of this disclosure may use a relatively low number of amplifier stages for lower power consumption. In case a VCO frequency shift occurs resulting from gain changes, a calibration engine may be enabled.

The techniques and circuitry described in this disclosure may, in some examples, be implemented on any combination of one or more integrated circuits or other devices. Although illustrative examples have been shown and described by way of example, a wide range of alternative examples are possible within the scope of the foregoing disclosure.

The invention claimed is:

1. An integrated circuit comprising:
a first coarse gain control circuit that includes:
 a first coarse gain input;
 a first coarse gain output;
 a first coarse gain control input; and
 a first set of passive devices;
a second coarse gain control circuit that includes:
 a second coarse gain input;
 a second coarse gain output;
 a second coarse gain control input; and
 a second set of passive devices;
a first amplifier stage that includes:
 a first amplifier that includes a first amplifier gain control input, a first amplifier input coupled to the first coarse gain output, and a first amplifier output; and
 a second amplifier that includes a second amplifier gain control input, a second amplifier input coupled to the second coarse gain output, and a second amplifier output;
a second amplifier stage that includes:
 a third amplifier that includes a third amplifier gain control input, a third amplifier input coupled to the first amplifier output, and a third amplifier output; and
 a fourth amplifier that includes a fourth amplifier gain control input, a fourth amplifier input coupled to the second amplifier output, and a fourth amplifier output,
wherein the first set of passive devices includes one of a plurality of inductors coupled in series, and a network of capacitors.

2. The integrated circuit of claim 1, wherein:
the first amplifier stage further comprises a first power supply that includes a first power supply input and a first power supply output coupled to the first amplifier gain control input and to the second amplifier gain control input; and
the second amplifier stage further comprises a second power supply that includes a second power supply input and a second power supply output coupled to the third amplifier gain control input and to the fourth amplifier gain control input.

3. The integrated circuit of claim 2, wherein:
the first power supply and the second power supply are each low-drop out regulators.

4. The integrated circuit of claim 3, wherein the first set of passive devices includes the network of capacitors, the network of capacitors including:
a first capacitor that includes a first terminal and a second terminal;
a second capacitor that includes a third terminal coupled to the second terminal, and a fourth terminal;
a third capacitor that includes a fifth terminal and a sixth terminal;
a fourth capacitor that includes a seventh terminal coupled to the sixth terminal, and an eighth terminal;
a fifth capacitor that includes a ninth terminal coupled to the second terminal and the third terminal, and a tenth terminal coupled to a first switch terminal of a first switch;
a sixth capacitor that includes an eleventh terminal coupled to a second switch terminal of the first switch, and a twelfth terminal coupled to the sixth terminal and the seventh terminal;
a seventh capacitor that includes a thirteenth terminal coupled to the fourth terminal, and a fourteenth terminal coupled to a third switch terminal of a second switch; and
an eighth capacitor that includes a fifteenth terminal coupled to a fourth switch terminal of the second switch, and a sixteenth terminal coupled to the eighth terminal.

5. The integrated circuit of claim 4, further comprising an oscillator, wherein:
the first terminal is configured to receive a single output signal from the oscillator; and
one of the second, third, fourth, sixth, and eighth terminals is coupled to the first coarse gain output based on a first coarse gain control signal received on the first coarse gain control input.

6. The integrated circuit of claim 5, wherein:
the first coarse gain control signal includes a plurality of components;
a first component of the plurality of components indicates an amount of attenuation; and
based on the first component, the first coarse gain control circuit is configured to select one of the second, third, fourth, sixth, and eighth terminals to couple to the first coarse gain output.

7. The integrated circuit of claim 1, further comprising:
an oscillator configured to output a single output signal to the first coarse gain input and to the second coarse gain input.

8. The integrated circuit of claim 1, wherein the first set of passive devices includes the plurality of inductors coupled in series, the plurality of inductors including:
a first inductor that includes a first terminal and a second terminal;
a second inductor that includes a third terminal coupled to the second terminal, and a fourth terminal;
a third inductor that includes a fifth terminal coupled to the fourth terminal, and a sixth terminal;
a fourth inductor that includes a seventh terminal coupled to the sixth terminal, and an eighth terminal;
a fifth inductor that includes a ninth terminal coupled to the eighth terminal, and a tenth terminal; and
a sixth inductor that includes an eleventh terminal coupled to the tenth terminal, and a twelfth terminal.

9. The integrated circuit of claim 8, wherein:
one of the second, fourth, sixth, eighth, tenth, and twelfth terminals is coupled to the first coarse gain output based on a coarse gain control signal received on the first coarse gain control input.

10. The integrated circuit of claim 9, wherein:
the coarse gain control signal includes a plurality of components;
a first component of the plurality of components indicates an amount of attenuation; and
based on the first component, the first coarse gain control circuit is configured to select one of the second, fourth, sixth, eighth, and twelfth terminals to couple to the first coarse gain output.

11. The integrated circuit of claim 1, further comprising:
an oscillator configured to provide a first oscillating signal at a first output to the first coarse gain control circuit and a second oscillating signal at a second output to the second coarse gain control circuit.

12. The integrated circuit of claim 1, wherein:
the second amplifier stage is coupled to a matching network of a transmitter.

13. A transmitter circuit comprising:
an oscillator that includes an oscillator output configured to output a single output signal;
a first coarse gain control circuit that includes:
 a first set of passive devices;
 a first coarse gain circuit input coupled to the oscillator output;
 a first gain control input to receive a first gain control signal; and
 a first coarse gain circuit output configured to output a first output signal;
 wherein the first coarse gain control circuit is configured to adjust the single output signal based on the first gain control signal;
a second coarse gain control circuit that includes:
 a second set of passive devices;
 a second coarse gain circuit input coupled to the oscillator output;
 a second gain control input configured to receive a first gain control signal; and
 a second coarse gain circuit output configured to output a first output signal;
 wherein the second coarse gain control circuit is configured to adjust the single output signal based on the first gain control signal; and a first amplifier stage that includes:
 a first amplifier that includes a first amplifier input coupled to the first coarse gain circuit output, a first amplifier output, and a third gain control input;
 a second amplifier that includes a second amplifier input coupled to the second coarse gain circuit output, a second amplifier output, and a fourth gain control input; and
 a first voltage source that includes a first voltage input configured to receive a second gain control signal, and a first voltage output coupled to the third gain control input and the fourth gain control input;
wherein the first set of passive devices comprises a plurality of inductors coupled in series, and
wherein the first set of passive devices is configured to adjust the single output signal to produce the first output signal.

14. The transmitter circuit of claim 13, further comprising:
a second amplifier stage that includes:
 a third amplifier that includes a third amplifier input coupled to the first amplifier output, a third amplifier output, and a fifth gain control input;
 a fourth amplifier that includes a fourth amplifier input coupled to the second amplifier output, a fourth amplifier output, and a sixth gain control input; and
 a second voltage source that includes a second voltage input configured to receive a third gain control signal, and a second voltage output coupled to the fifth gain control input and the sixth gain control input.

15. The transmitter circuit of claim 13, wherein:
the oscillator includes:
 a first transistor having a first control input, a first current terminal, and a second current terminal; and
 a second transistor having a second control input coupled to the first current terminal, a third current terminal coupled to the first control input, and a fourth current terminal coupled to the second current terminal.

16. The transmitter circuit of claim 13, wherein:
the first gain control signal indicates an amount of attenuation; and
the first coarse gain control circuit is configured to attenuate the single output signal based on the amount of attenuation.

17. The transmitter circuit of claim 13, wherein the second set of passive devices includes:
a first capacitor that includes a first terminal and a second terminal;
a second capacitor that includes a third terminal coupled to the second terminal, and a fourth terminal;
a third capacitor that includes a fifth terminal and a sixth terminal;
a fourth capacitor that includes a seventh terminal coupled to the sixth terminal, and an eighth terminal;
a fifth capacitor that includes a ninth terminal coupled to the second terminal and the third terminal, and a tenth terminal coupled to a first switch terminal of a first switch;
a sixth capacitor that includes an eleventh terminal coupled to a second switch terminal of the first switch, and a twelfth terminal coupled to the sixth terminal and the seventh terminal;

a seventh capacitor that includes a thirteenth terminal coupled to the fourth terminal, and a fourteenth terminal coupled to a third switch terminal of a second switch; and an eighth capacitor that includes a fifteenth terminal coupled to a fourth switch terminal of the second switch, and a sixteenth terminal coupled to the eighth terminal.

18. The transmitter circuit of claim 13, wherein the first set of passive devices includes:
    a first inductor that includes a first terminal and a second terminal;
    a second inductor that includes a third terminal coupled to the second terminal, and a fourth terminal;
    a third inductor that includes a fifth terminal coupled to the fourth terminal, and a sixth terminal;
    a fourth inductor that includes a seventh terminal coupled to the sixth terminal, and an eighth terminal;
    a fifth inductor that includes a ninth terminal coupled to the eighth terminal, and a tenth terminal; and
    a sixth inductor that includes an eleventh terminal coupled to the tenth terminal, and a twelfth terminal.

19. A transmitter circuit comprising:
    an oscillator that includes an oscillator output configured to output a single output signal,
    a first coarse gain control circuit that includes:
        a first set of passive devices;
        a first coarse gain circuit input coupled to the oscillator output;
        a first gain control input to receive a first gain control signal; and
        a first coarse gain circuit output configured to output a first output signal;
        wherein the first coarse gain control circuit is configured to adjust the single output signal based on the first gain control signal;
    a second coarse gain control circuit that includes:
        a second set of passive devices;
        a second coarse gain circuit input coupled to the oscillator output;
        a second gain control input configured to receive a first gain control signal; and
        a second coarse gain circuit output configured to output a first output signal;
        wherein the second coarse gain control circuit is configured to adjust the single output signal based on the first gain control signal; and
    a first amplifier stage that includes:
        a first amplifier that includes a first amplifier input coupled to the first coarse gain circuit output, a first amplifier output, and a third gain control input;
        a second amplifier that includes a second amplifier input coupled to the second coarse gain circuit output, a second amplifier output, and a fourth gain control input; and
        a first voltage source that includes a first voltage input configured to receive a second gain control signal, and a first voltage output coupled to the third gain control input and the fourth gain control input;
    wherein the first set of passive devices is configured to adjust the single output signal to produce the first output signal, and
    wherein the second set of passive devices includes a plurality of capacitors.

* * * * *